(12) United States Patent
Park et al.

(10) Patent No.: US 8,303,084 B2
(45) Date of Patent: Nov. 6, 2012

(54) INKJET PRINTHEAD AND METHOD OF MANUFACTURING THE SAME

(75) Inventors: Byung-ha Park, Suwon-si (KR);
Sung-jun Park, Hwaseong-si (KR);
Young-ung Ha, Suwon-si (KR);
Woo-sung Jeon, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 420 days.

(21) Appl. No.: 12/571,605

(22) Filed: Oct. 1, 2009

(65) Prior Publication Data
US 2010/0079548 A1 Apr. 1, 2010

(30) Foreign Application Priority Data
Oct. 1, 2008 (KR) .................. 10-2008-0096717

(51) Int. Cl.
*B41J 2/14* (2006.01)

(52) U.S. Cl. .......................................... 347/47
(58) Field of Classification Search .................... 347/47, 347/45, 44
See application file for complete search history.

(56) References Cited

U.S. PATENT DOCUMENTS

| | | | |
|---|---|---|---|
| 6,341,842 B1 * | 1/2002 | Beach et al. .................... 347/45 |
| 2009/0185003 A1 * | 7/2009 | Bertelsen et al. ............... 347/47 |
| 2010/0078407 A1 * | 4/2010 | Lebens et al. ................... 347/47 |

* cited by examiner

Primary Examiner — Kristal Feggins
(74) Attorney, Agent, or Firm — Stanzione & Kim, LLP

(57) ABSTRACT

An inkjet printhead to prevent clogging of nozzles and spreading of ink during ejection, and a method of manufacturing the inkjet printhead. The inkjet printhead includes a substrate, a passage forming layer formed on the substrate, and a nozzle layer formed on the passage forming layer and including a material including an epoxy group or a hydroxyl group, wherein the epoxy group or the hydroxyl group is protected by an alcohol-protecting group.

14 Claims, 13 Drawing Sheets

INKJET PRINTHEAD AND METHOD OF MANUFACTURING THE SAME

CROSS-REFERENCE TO RELATED APPLICATIONS

This application claims the benefit of priority under 35 U.S.C. §119(a) from Korean Patent Application No. 10-2008-0096717, filed on Oct. 1, 2008, in the Korean Intellectual Property Office, the disclosure of which is incorporated herein by reference in its entirety.

BACKGROUND

1. Field of the Invention

The present general inventive concept relates to an inkjet printhead and a method of manufacturing the same, and more particularly, to an inkjet printhead that prevents clogging of nozzles and ink spreading during ejection, and a method of manufacturing the inkjet printhead.

2. Description of the Related Art

In general, inkjet printheads eject fine droplets of ink for printing at desired positions on a recording medium to print images of predetermined colors. Inkjet printheads can be classified into two types according to the mechanism of ejecting an ink droplet. One is a thermally-driven type inkjet printhead which generates bubbles in the ink using a heat source to eject ink droplets due to an expansion force of the bubbles. The other one is a piezoelectric type inkjet printhead which ejects ink droplets due to pressure applied to the ink by a deformation of a piezoelectric body. The two types of inkjet printheads eject ink droplets using a constant energy, however the driving devices for the two types of inkjet printheads are different.

FIG. 1 is a sectional view illustrating a general structure of a conventional thermally-driven type inkjet printhead.

Referring to FIG. 1, a conventional thermally-driven inkjet printhead includes a substrate 10, a passage forming layer 20 stacked on the substrate 10, and a nozzle layer 30 formed on the passage forming layer 20. An ink feed hole 51 is formed in the substrate 10. The passage forming layer 20 has an ink chamber 53 to store ink, and a restrictor 52 to connect the ink feed hole 51 and the ink chamber 53. The nozzle layer 30 has a nozzle 54 through which the ink is ejected from the ink chamber 53. Also, the substrate 10 has a heater 41 for heating ink in the ink chamber 53, and an electrode 42 for supplying current to the heater 41.

The ink ejection mechanism of the conventional thermally-driven inkjet printhead having the above-described configuration will now be described. Ink is supplied from an ink reservoir (not illustrated) to the ink chamber 53 through the ink feed hole 51 and the restrictor 52. The ink filled in the ink chamber 53 is heated by the heater 41 consisting of resistive heating elements. The ink boils to form bubbles and the bubbles expand, thereby increasing the pressure of the ink in the ink chamber 53. Accordingly, the ink in the ink chamber 53 is ejected outside the ink chamber 53 through the nozzle 54 in the form of ink droplets.

As an example of a method of fabricating an inkjet printhead, U.S. Patent Application Publication No. 2007/0017894 describes a method of fabricating an inkjet printhead. The method includes forming a plurality of passage walls on a substrate wherein an energy generating device is disposed on the substrate, and stacking covering materials on top surfaces of the passage walls between the passage walls. The method also includes planarizing by polishing upper portions of covering materials until upper portions of the passage walls are exposed, and forming an orifice plate on the upper portions of the polished covering materials and the exposed passage walls.

However, in the conventional method of manufacturing an inkjet printhead described above, a material for forming the nozzles is formed of SU-8 resin, polyfunctional epoxy resin, or the like, and the material also includes an epoxy group or a hydroxyl group as a substitution group.

When nozzles are formed using a compound containing an epoxy, the surface of the nozzles may be deformed due to an instant temperature increase when ink components pass through a heater and react with the epoxy group on the surface of the nozzles. Also, when nozzles are formed using a compound containing a hydroxyl group, the compound containing the hydroxyl group on the surface of the nozzles may react with reactant materials among the ink components and thereby deform the surface of the nozzles, or the compound containing the hydroxyl group may trap metal ions that pass through the nozzles and thus induce accumulation of the metal ions or form a new material in the form of a composite, thereby causing clogging of the nozzles.

SUMMARY

Accordingly, an inkjet printhead capable of preventing clogging of nozzles and improving image quality, and a method of manufacturing the inkjet printhead are required.

The present general inventive concept provides an inkjet printhead that prevents clogging of nozzles and improves image quality. The present general inventive concept also provides a method of manufacturing the inkjet printhead.

Additional features and utilities of the present general inventive concept will be set forth in part in the description which follows and, in part, will be obvious from the description, or may be learned by practice of the general inventive concept.

Embodiments of the present general inventive concept can be achieved by providing an inkjet printhead including a substrate, a passage forming layer formed on the substrate, and a nozzle layer formed on the passage forming layer and including a material comprising an epoxy group or a hydroxyl group, wherein the epoxy group or the hydroxyl group is protected by an alcohol-protecting group.

The alcohol-protecting group may include one of an acetyl group, a beta-methoxyethoxymethyl ether (MEM), a methoxymethyl ether (MOM), a p-methoxybenzyl ether (PMB), a methylthiomethyl ether, a pivaloyl (Piv), a tetrahydropyran (TFP), and silyl ether, for example, trimethyl silyl (TMS), tert-butyldimethyl silyl (TBDMS), and triisopropyl silyl ether.

A portion of a surface of the nozzle layer not including inner walls of a nozzle of the nozzle layer may be protected, or a surface of the nozzle layer including inner walls of a nozzle of the nozzle layer may be protected, using the alcohol-protecting group.

The epoxy group of the nozzle layer may be protected by converting the epoxy group to a hydroxyl group by hydrolysis and then protecting the hydroxyl group with an alcohol-protecting group.

The material of the nozzle layer may including a polymer having at least one prepolymer selected from the group consisting of compounds expressed by Formulae 1 through 9 below:

<Formula 1>
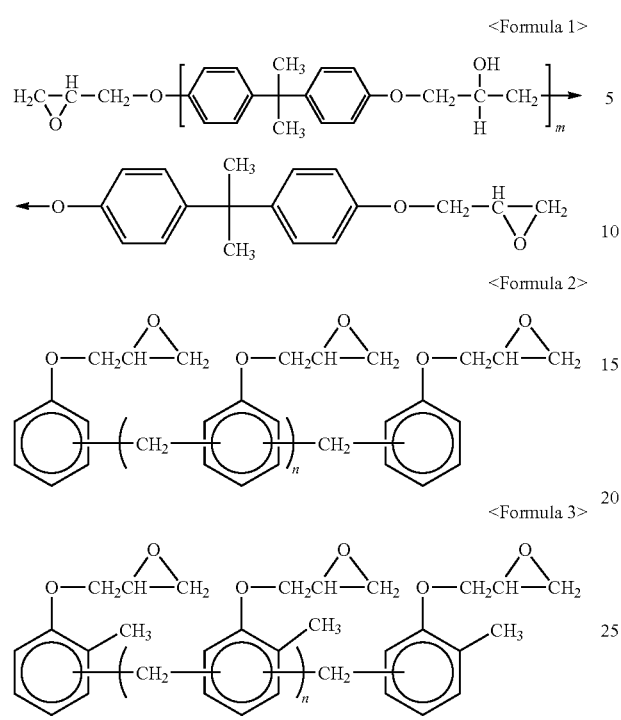
<Formula 2>
<Formula 3>
<Formula 4>
<Formula 5>
<Formula 6>
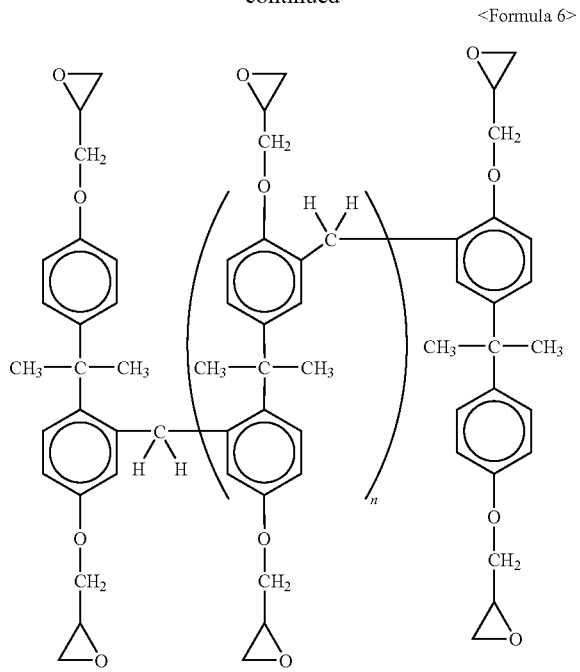
<Formula 7>
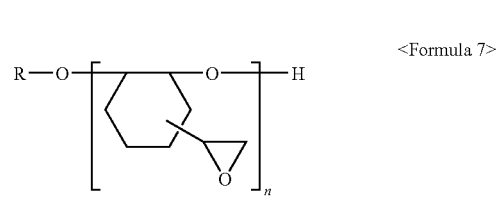
<Formula 8>
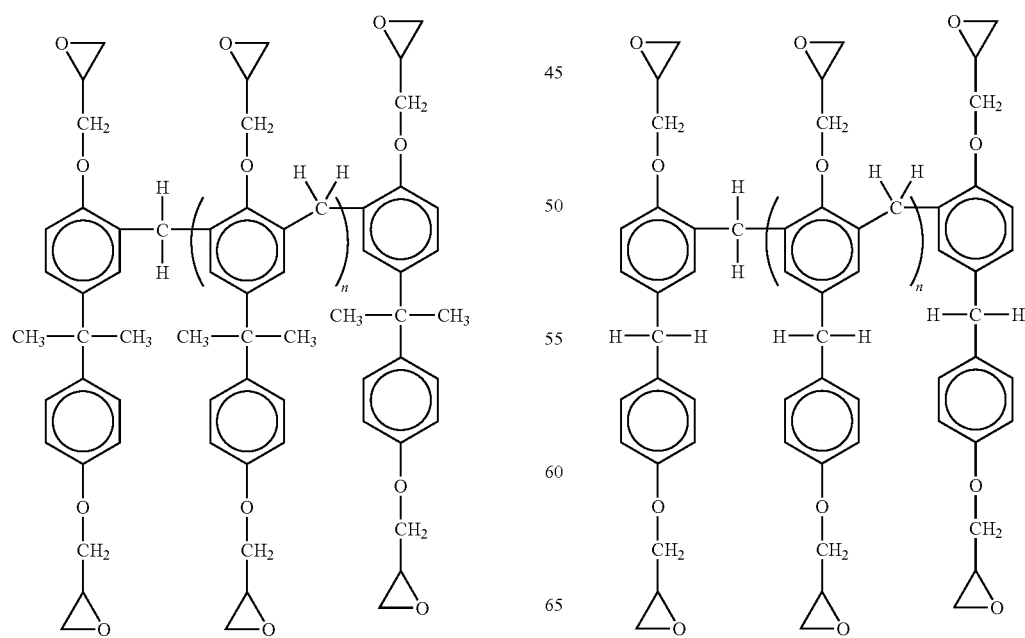

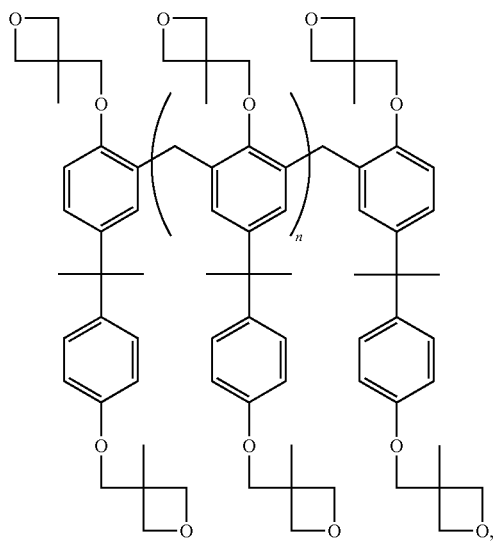

<Formula 9> where m is an integer in the range of about 1 through about 20, and n is an integer in the range of about 1 through about 20.

Embodiments of the present general inventive concept can also be achieved by providing a method of manufacturing an inkjet printhead including, forming a heater to heat ink and an electrode for supplying current to the heater on a substrate, coating the substrate on which the heater and the electrode are formed with a first negative photoresist composition, and patterning the substrate to form a passage forming layer defining an ink passage, forming a sacrificial layer on the substrate to cover the passage forming layer, planarizing top surfaces of the passage forming layer and the sacrificial layer, coating the passage forming layer and the sacrificial layer with a second negative photoresist composition, protecting a coating layer of the second negative photoresist composition using an alcohol-protecting group, forming a nozzle layer having at least one nozzle by patterning the coating layer of the second negative photoresist composition, forming an ink feed hole in the substrate; and removing the sacrificial layer.

Embodiments of the present general inventive concept can also be achieved by providing a method of manufacturing an inkjet printhead, including forming a heater to heat ink and an electrode for supplying current to the heater on a substrate, coating the substrate on which the heater and the electrode are formed with a first negative photoresist composition, and patterning the substrate to form a passage forming layer defining an ink passage, forming a sacrificial layer on the substrate to cover the passage forming layer, planarizing top surfaces of the passage forming layer and the sacrificial layer, coating the passage forming layer and the sacrificial layer with a second negative photoresist composition, protecting a coating layer of the second negative photoresist composition using an alcohol-protecting group, forming a nozzle layer having at least one nozzle by patterning the coating layer of the second negative photoresist composition, protecting a surface of the nozzle layer using the alcohol-protecting group, forming an ink feed hole in the substrate, and removing the sacrificial layer.

Each of the first and second negative photoresist compositions may include a prepolymer having a glycidyl ether functional group, a ring-opened glycidyl ether functional group, or an oxytein functional group and also having a phenol Novolac resin backbone, a bisphenol-A-based backbone, a bisphenol-F-based backbone, or an alicyclic backbone on monomer repeating units thereof, a cationic photoinitiator, a solvent, and a plasticizer.

The substrate and the nozzle layer may be patterned using a photolithographic process.

The planarizing may be performed using a polishing process.

The polishing process may include a chemical mechanical planarization (CMP) process.

Each of the first and second negative photoresist compositions may include 1 to 10 parts by weight of the cationic photoinitiator, 30 to 300 parts by weight of a solvent, and 1 through 15 parts by weight of a plasticizer, based on 100 parts by weight of the prepolymer.

Embodiments of the present general inventive concept can also be achieved by providing an inkjet printhead including, a nozzle layer including a plurality of nozzles, and an alcohol-protecting group formed on the nozzle layer to protect the nozzle layer.

The nozzle layer may be formed of a material including an epoxy group or a hydroxyl group.

The inkjet printhead may further include a substrate, and a passage forming layer formed on the substrate, wherein the nozzle layer is formed on the passage forming layer.

The alcohol-protecting group may be formed on a surface of the nozzle layer that faces away from the passage forming layer.

The alcohol-protecting group may be formed on inner walls of the nozzle layer.

The alcohol-protecting group is formed between the passage forming layer and the nozzle layer.

Embodiments of the present general inventive concept can also be achieved by providing a method of manufacturing an inkjet printhead, including forming a substrate, forming a passage forming layer on the substrate to define an ink passage, forming a nozzle layer having a nozzle on the passage forming layer, and protecting the nozzle layer using an alcohol-protecting group.

The method may also include protecting the passage forming layer by applying the alcohol-protecting group between the passage forming layer and the nozzle layer.

The protecting of the nozzle layer may include applying the alcohol-protecting group to a surface of the nozzle layer that faces away from the passage forming layer.

The applying of the alcohol-protecting group may include applying the alcohol-protecting group to inner walls of the nozzle layer.

The protecting of the nozzle layer may include forming a protective layer on a surface of the nozzle layer using the alcohol-protecting group.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings, in which.

DETAILED DESCRIPTION OF THE EMBODIMENTS

Figure 1:
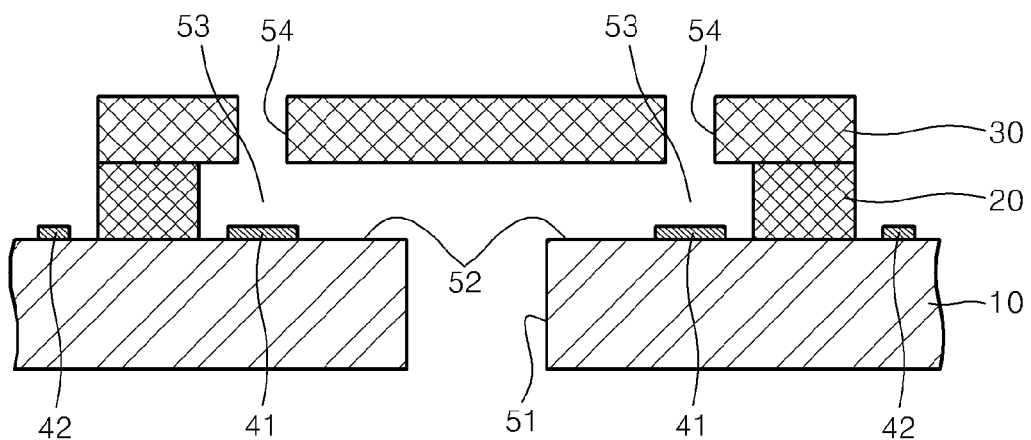
FIG. 1 is a sectional view illustrating a general structure of a conventional thermally-driven type inkjet printhead.

Reference will now be made in detail to the exemplary embodiments of the present general inventive concept, examples of which are illustrated in the accompanying drawings, wherein like reference numerals refer to the like elements throughout. The exemplary embodiments are described below to explain the present general inventive concept by referring to the figures. The present general inventive concept, however, should not be construed as being limited to the exemplary embodiments set forth herein; rather, these exemplary embodiments are provided so that this disclosure will fully convey the concept of the present general inventive concept to those skilled in the art. In the drawings, the dimension or thickness of each element may be exaggerated for clarity. It will also be understood that when a layer is referred to as being "on" a substrate or another layer, it can be directly on the substrate or other layer, or intervening layers may also be present.

Hereinafter, a thermally driven type inkjet printhead will be described. However, the present general inventive concept can also be applied to a piezoelectric-driven type printhead, and further to a monolithic type inkjet printhead and a junction type inkjet printhead. In addition, the following drawings illustrate a very small portion of a silicon wafer, and an inkjet printhead according to the present general inventive concept can be manufactured in the form of tens to hundreds of chips on a single wafer.

An inkjet printhead according to exemplary embodiments of the present general inventive concept includes a substrate, a passage forming layer formed on the substrate, and a nozzle layer formed on the passage forming layer, wherein an epoxy group or a hydroxyl group in a material to form the nozzle layer is protected using an alcohol-protecting group.

In other words, a reactive functional group in the material of the nozzle layer, such as an epoxy group or a hydroxyl group, is protected using an alcohol-protecting group to reduce the reactivity of the reactive functional group. The alcohol-protecting group increases protection of the nozzle layer and decreases the reaction of a surface of the nozzle layer with ink components such as metal or organic materials containing electron pairs and reduces the deformation of the nozzle layer.

The alcohol-protecting group is bonded to the reactive functional group, i.e., the epoxy group or the hydroxyl group, contained in the surface of the nozzle layer. For example, the epoxy group may be first hydrolyzed and ring-opened to two hydroxyl groups. An alcohol-protecting group may be bonded to the two hydroxyl groups.

The alcohol-protecting group may be any protecting group that can be bonded to a hydroxyl group. Examples of an alcohol-protecting group include, but are not limited to, an acetyl group, a beta-methoxyethoxymethyl ether (MEM), methoxymethyl ether (MOM), p-methoxy benzyl ether (PMB), methylthiomethyl ether, pivaloyl (Piv), tetrahydropyran (THP), and silyl ether such as trimethylsilyl (TMS), tert-butyldimethylsilyl (TBDMS), and triisopropylsilyl ether. The protecting group is dissolved in an organic solvent as a protecting solution, and the protecting solution is applied to the surface of the nozzle layer by dipping, spin coating, vapor deposition, or the like. The protecting group is bonded to the hydroxyl group or the epoxy group using a baking process, a drying process, or the like.

According to exemplary embodiments of the present general inventive concept, the surface of the nozzle layer that is protected using the alcohol-protecting group may be protected except for inner walls of a nozzle or the surface of the nozzle layer including the inner walls of the nozzle layer is protected. In other words, a surface of the nozzle layer opposite to the passage forming layer may be protected with the alcohol-protecting group. Additionally, all exposed surfaces of the nozzle layer may be protected with the alcohol-protecting group.

The nozzle layer protected by the alcohol-protecting group includes an epoxy group and/or hydroxyl group, since a main component of a photoresist material used to form the nozzle layer is a polymerization prepolymer. The polymerization prepolymer may include, but is not limited to, a glycidyl ether functional group, a ring-opened glycidyl ether functional group, or an oxytein functional group. The polymerization prepolymer may also include, but is not limited to, a phenol Novolac resin backbone, a bisphenol-A-based backbone, a bisphenol-F-based backbone, or an alicyclic backbone on repeating monomer units thereof.

The polymerization prepolymer may be selected from at least one of the group of compounds expressed by Formulae 1 through 9 below:

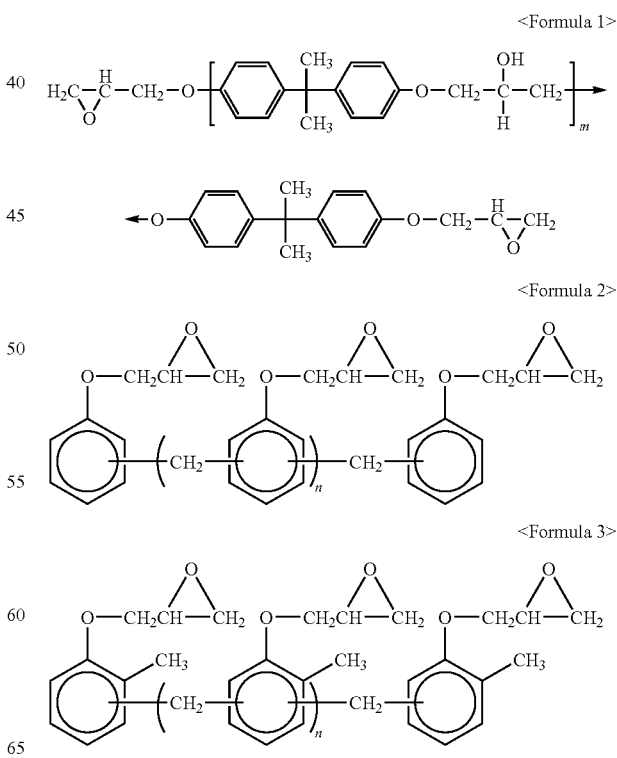

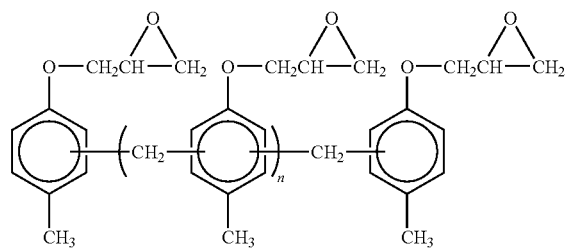

<Formula 4>

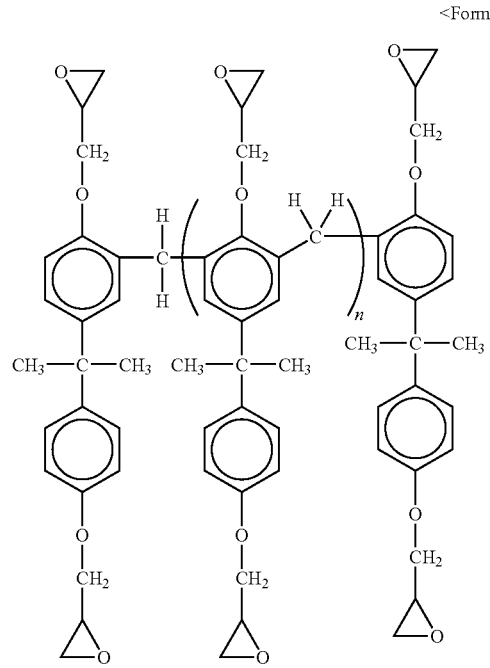

<Formula 5>

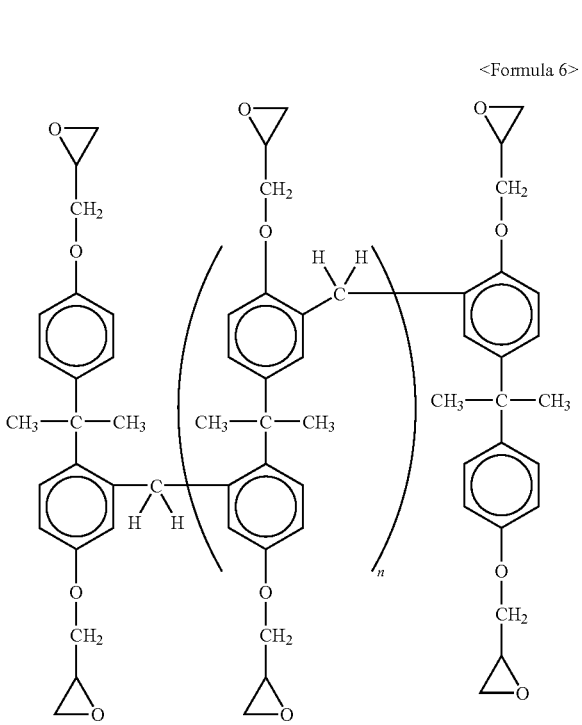

<Formula 6>

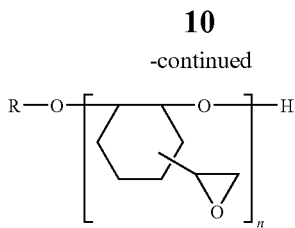

<Formula 7>

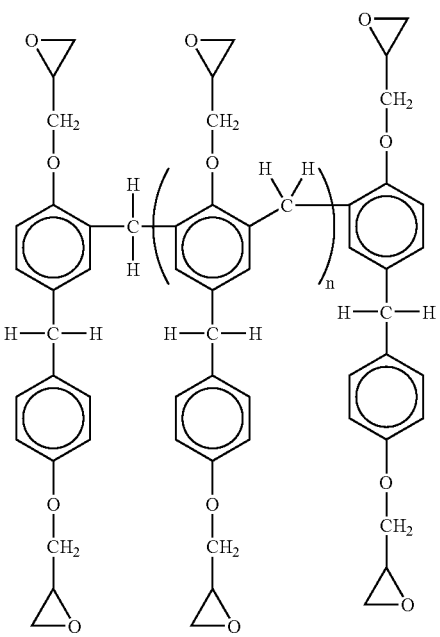

<Formula 8>

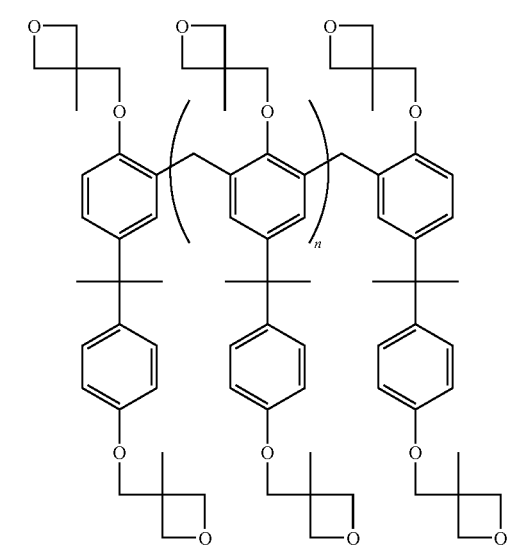

<Formula 9> where m is an integer in the range of about 1 through about 20, and n is an integer in the range of about 1 through about 20.

When a nozzle layer is formed using the polymerization prepolymer as a photoresist composition, the nozzle layer includes an epoxy group and/or a hydroxyl group. An alcohol-protecting group is bonded to the epoxy group and/or hydroxyl group and reduces the reactivity thereof.

As described above, a method of manufacturing the inkjet printhead protected using the alcohol-protecting group further includes an alcohol-protecting group bonding process, which may be performed before or after forming a nozzle.

When the alcohol-protecting group bonding process is performed before forming a nozzle, a surface of a nozzle layer where no nozzle is yet formed is bonded to the alcohol-protecting group, and then a nozzle is formed thereafter. Thus, the alcohol-protecting group is not formed on inner walls of the nozzle.

When the alcohol-protecting group bonding process is performed after forming a nozzle, a surface of the nozzle layer including inner walls of the nozzle may be protected using the alcohol-protecting group.

Hereinafter, a method of manufacturing an inkjet printhead according to exemplary embodiments of the present general inventive concept will be described in detail.

A method of manufacturing an inkjet printhead, in which a surface of a portion of a nozzle layer not including the nozzle is protected by the alcohol-protecting group, may include forming a heater for heating ink and an electrode for supplying current to the heater on a substrate, and coating the substrate on which the heater and the electrode are formed with a first negative photoresist composition and patterning the substrate using a photolithographic process to form a passage forming layer defining an ink passage. The method of manufacturing the inkjet printhead may also include forming a sacrificial layer on the substrate to cover the passage forming layer, planarizing top surfaces of the passage forming layer and the sacrificial layer using a polishing process, coating the passage forming layer and the sacrificial layer with a second negative photoresist composition, protecting a coating layer of the second negative photoresist composition using an alcohol-protecting group, forming a nozzle layer having a nozzle by patterning the coating layer of the second negative photoresist composition using a photolithographic process, forming an ink feed hole in the substrate, and removing the sacrificial layer.

According to exemplary embodiments of the present general inventive concept, a method of manufacturing an inkjet printhead, in which surfaces of the nozzle layer including the nozzle are protected by the alcohol-protecting group, may include forming a heater to heat ink and an electrode for supplying current to the heater on a substrate, and coating the substrate on which the heater and the electrode are formed with a first negative photoresist composition and patterning the substrate using a photolithographic process to form a passage forming layer defining an ink passage. The method of manufacturing the inkjet printhead according to exemplary embodiments may also include forming a sacrificial layer on the substrate to cover the passage forming layer, planarizing top surfaces of the passage forming layer and the sacrificial layer using a polishing process, coating the passage forming layer and the sacrificial layer with a second negative photoresist composition, protecting a coating layer of the second negative photoresist composition using an alcohol-protecting group, forming a nozzle layer having a nozzle by patterning the coating layer of the second negative photoresist composition using a photolithographic process, forming an ink feed hole in the substrate, and removing the sacrificial layer.

In the manufacturing methods described above, the above-described alcohol-protecting group may be used. The alcohol-protecting group may form a solution with an organic solvent such as N-methylpyrrolidone, propylene glycol methyl ether acetate (PGMEA), tetrahydrofurane, cyclopentanone, or the like, and may be applied using an application method such as dipping, spin coating, vapor deposition, or the like. Once the alcohol-protecting group is applied, a soft baking process may preferably be conducted at a temperature of about 100° C. to 120° C. for 5 through 10 minutes.

Each of the first and second negative photoresist compositions used in the manufacturing methods above may include a prepolymer having a glycidyl ether functional group, a ring-opened glycidyl ether functional group, or an oxytein functional group. Each of the first and second negative photoresist compositions may also include a phenol Novolac resin backbone, a bisphenol-A-based backbone, a bisphenol-F-based backbone, or an alicyclic backbone on repeating monomer units thereof. Additionally, each of the first and second negative photoresist compositions may also include a cationic photoinitiator, a solvent, and a plasticizer. The first and second negative photoresist compositions may be the same or different, and may preferably be the same.

The prepolymer in the first and second negative photoresist compositions may form a cross-linked polymer by being exposed to actinic rays.

The prepolymer may preferably be formed from a backbone monomer selected from the group including, but not limited to, phenol, o-cresol, p-cresol, bisphenol-A, alicylclic compound, and compounds thereof.

Examples of the prepolymer having the glycidyl ether functional group include, but are not limited to, a bifunctional gylcidyl ether functional group and a poly-functional glycidyl ether functional group, and the like. Hereinafter, a prepolymer having a bifunctional glycidyl ether functional group and a prepolymer having a poly-functional glycidyl ether functional group will be described.

A prepolymer having a bifunctional glycidyl ether may be a compound expressed by Formula 1 below:

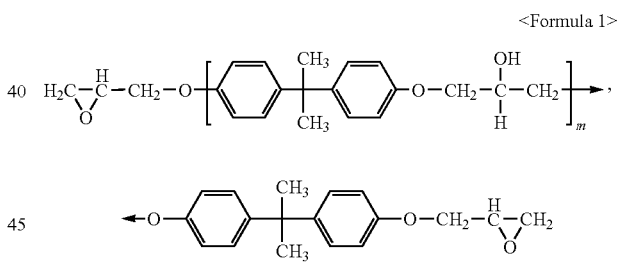

<Formula 1> where m is an integer in the range of about 1 through about 20.

The prepolymer having the bifunctional glycidyl ether functional group may form a layer with low cross-linking density.

Examples of the prepolymer having the bifunctional glycidyl ether functional group include, but are not limited to, EPON 828, EPON 1004, EPON 1001F, and EPON 101 commercially available from Shell Chemicals, DER-332, DER-331, and DER-164 commercially available from Dow Chemicals, and ERL-4201 and ERL-4289 commercially available from Union Carbide, and the like.

Examples of the prepolymer having the polyfunctional glycidyl ether functional group include, but are not limited to, EPON SU-8 and EPON DPS-164 commercially available from Shell Chemicals, DEN-431 and DEN-439 commercially available from Dow Chemicals, or EHPE-3150 commercially available from Daicel Chemicals, and the like.

Examples of the prepolymer having a glycidyl ether functional group and a phenol novolac resin backbone on repeating monomer units thereof include a compound expressed by Formula 2 below:

<Formula 2>

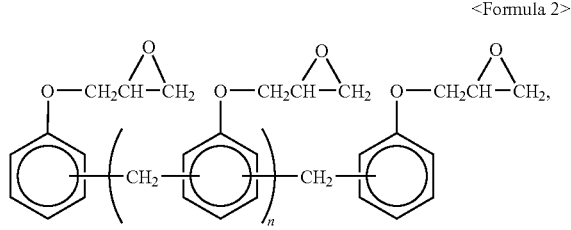

where n is an integer in the range of about 1 through about 20, preferably 1 through 10.

Also, examples of the prepolymer having a glycidyl ether functional group and a phenol novolac resin backbone on repeating monomer units thereof may include compounds expressed by Formulae 3 and 4 as below, where o-cresol or p-cresol is used instead of phenol:

<Formula 3>

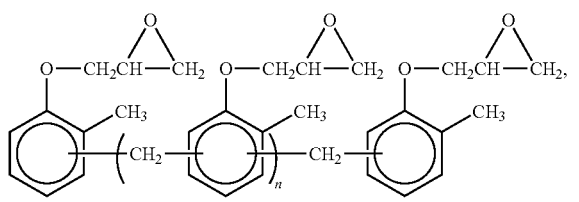

<Formula 4>

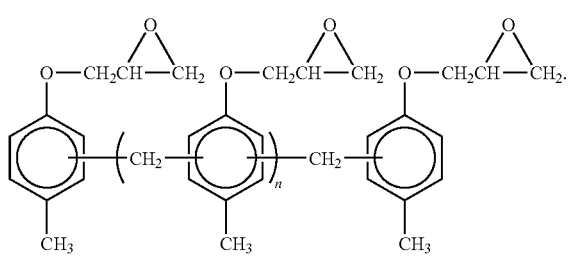

Examples of the prepolymer having a glycidyl ether functional group and also a bisphenol-A-based backbone on the repeating monomer units thereof may include compounds expressed by Formulae 5 and 6 as below:

<Formula 5>

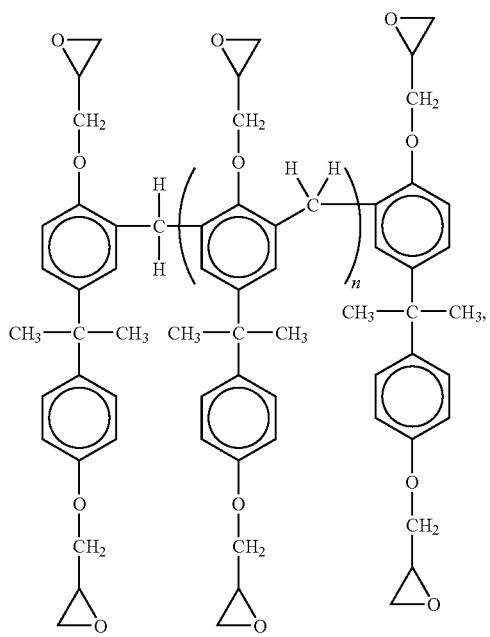

<Formula 6>

A prepolymer having a glycidyl ether functional group and an alicylclic backbone on the repeating monomer units thereof may be expressed by Formula 7 below. Examples of the prepolymer include, but are not limited to addition products of 1,2-epoxy-4(2-oxiranyl)-cyclohexane of 2,2-bis(hydroxy methyl)-1-butanol which is available under the product name EHPH-3150.

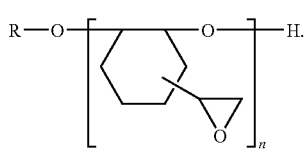
<Formula 7>

A prepolymer having a glycidyl ether functional group and a bisphenol-F-based backbone on the repeating monomer units thereof may be expressed by Formula 8 below:

<Formula 8>
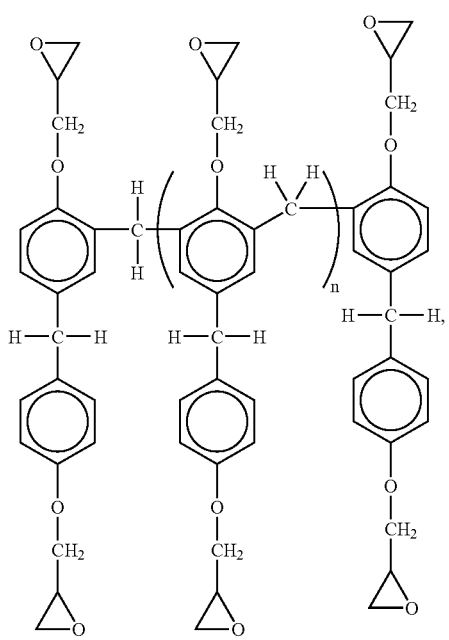

where n is an integer in the range of about 1 through about 20, preferably 1 through 10.

A prepolymer having an oxytein functional group and a bisphenol-A-based backbone on the repeating monomer units thereof may be expressed by Formula 9 below:

<Formula 9>
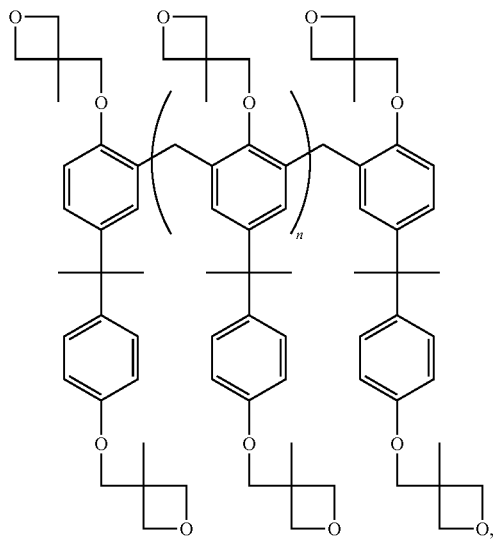

where n is an integer in the range of about 1 through about 20, preferably 1 through 10.

The prepolymer may preferably include at least one of the compounds of Formulae 1 through 9.

The cationic photoinitiator contained in the first and second negative photoresist composition according to the present general inventive concept may be generally a photoinitiator to generate ions or free radicals that initiate polymerization when exposed to light. Examples of the cationic photoinitiator may include, but are not limited to, an aromatic halonium salt or a sulfonium salt of a Group VA or VI element, and the like, such as UVI-6974 commercially available from Union Carbide or SP-172 commercially available from Asashi denka, and the like.

Examples of the aromatic sulfonium salt may include, but are not limited to, triphenylsulfonium tetrafluoroborate, triphenylsulfonium hexafluoroantimonate (UVI-6974), phenylmethylbenzylsulfonium hexafluoroantimonate, phenylmethylbenzylsulfonium hexafluorophosphate, triphenylsulfonium hexafluorophosphate, methyl diphenylsulfonium tetrafluoroborate, dimethyl phenylsulfonium hexafluorophosphate, and the like.

The aromatic halonium salt may be an aromatic iodonium salt. Examples of the aromatic iodonium salt may include, but are not limited to, diphenyliodonium tetrafluoroborate, diphenyliodonium hexafluoroantimonate, butylphenyliodonium hexafluoroantimonate (SP-172), and the like.

The content of the cationic photoinitiator may be 1-10 parts by weight based on 100 parts by weight of the prepolymer. The content of the cationic photoinitiator may preferably be 1.5-5 parts by weight based on 100 parts by weight of the prepolymer. When the content of the cationic photoinitiator is less than 1 part by weight based on 100 parts by weight of the prepolymer, a cross-linking reaction may be reduced. When the content of the cationic photoinitiator is greater than 10 parts by weight based on 100 parts by weight of the prepolymer, the cross-linking speed may be reduced.

A solvent used in the first and second negative photoresist compositions according to exemplary embodiments of the present general inventive concept may include at least one selected from the group including, but not limited to, γ-butyrolactone, propylene glycol methyl ethyl acetate, tetrahydrofurane, methyl ethyl ketone, methyl isobutyl ketone, cyclophentanone, and xylene.

The content of the solvent may be 30-300 parts by weight based on 100 parts by weight of the prepolymer. The content of the solvent may preferably be 50-200 parts by weight based on 100 parts by weight of the prepolymer. When the content of the solvent is less than 30 parts by weight based on 100 parts by weight of the prepolymer, viscosity is increased, thus working efficiency is reduced by increasing the difficulty in forming the first or second negative photoresist layers. When the content of the solvent is greater than 300 parts by weight based on 100 parts by weight of the prepolymer, viscosity of the obtained polymer is decreased, thus the difficulty in forming patterns is increased.

The plasticizer included in the first and second negative photoresist compositions according to exemplary embodiments of the present general inventive concept can reduce cracks formed in the nozzle layer after nozzle development and removal of the sacrificial layer, and also improve image quality adversely affected by Y spacing by reducing deviations in the degree of inclination of the nozzles. By adding a plasticizer having a high boiling point to the cross-linked polymers to have a lubricating effect, these advantages can be obtained, thereby reducing stress in the nozzle layer. Furthermore, an additional baking process may be minimized or eliminated if the plasticizer is added, thereby simplifying the manufacturing process.

Examples of the plasticizer may include, but are not limited to, phthalic acids, trimellite acids, and phosphite acids. Examples of the phthalic acid may include, but are not limited to, dioctyl phthalate (DOP), diglycidyl hexahydro phthalate (DGHP), and so forth. Examples of the trimellite acid may include, but are not limited to, triethylhexyl trimellitate, and the like. Examples of the phosphite may include, but are not limited to, tricresil phosphate, and the like. These materials may be used alone, or two or more of these materials may be used in combination with one another.

The content of the plasticizer may be 1 to 15 parts by weight of the prepolymer. The content of the plasticizer may preferably be 5 to 10 parts by weight, based on 100 parts by weight of the prepolymer. When the content of the plasticizer is less than 1 part by weight, the effect of the plasticizer may be reduced, and when the content of the plasticizer is greater than 15 parts by weight, the cross-linking density of the prepolymer may be decreased.

Additional additives, photosensitizers, fillers, viscosity modifiers, wetting agents, photostabilizers, and the like can be used in the first and second negative photoresist compositions. The amount of each of the additional additives may be 0.1-20 parts by weight based on 100 parts by weight of the prepolymer.

The photosensitizers absorb light energy and facilitate the transfer of energy to another compound, which can then form radical or ionic photoinitiators. The photosensitizers frequently expand a useful energy wavelength range for photoexposure, and typically are aromatic light absorbing chromophores. In addition, the photosensitizers can also lead to the formation of radical or ionic photoinitiators.

The substrate may be a silicon wafer.

The forming of a passage forming layer may include coating the first negative photoresist composition on the entire surface of the substrate to form a first photoresist layer, exposing the first photoresist layer to light using a first photo mask having an ink passage pattern, and developing the first photoresist layer to remove an unexposed portion of the first photoresist layer to form the passage forming layer.

The sacrificial layer may include a positive photoresist or non-photosensitive soluble polymer. The term "soluble" refers to a property of being dissolved by a specific solvent. The positive photoresist may be an imide-based positive photoresist. The non-photosensitive soluble polymer may be at least one selected from the group including, but not limited to, a phenol resin, a polyurethane resin, an epoxy resin, a polyimide resin, an acryl resin, a polyamide resin, an urea resin, a melamin resin, and a silicon resin.

The sacrificial layer is formed to have a greater height than that of the passage forming layer. Herein, the sacrificial layer may be formed by spin coating.

In the planarizing of the top surfaces of the passage forming layer and the sacrificial layer, the top surfaces of the passage forming layer and the sacrificial layer may be planarized through a polishing process until the ink passage has a desired height. The polishing process may include a chemical mechanical planarization (CMP) process.

The forming of a nozzle layer may include coating the second negative photoresist composition on the passage forming layer and the sacrificial layer to form a second photoresist layer, exposing the second photoresist layer to light using a second photo mask having a nozzle pattern, and developing the second photoresist layer, thereby removing an unexposed portion of the second photoresist layer to form a nozzle and a nozzle layer.

The forming of an ink feed hole may include coating a rear surface of the substrate with a photoresist; forming an etching mask by patterning the photoresist for forming an ink feed hole and etching the rear surface of the substrate that is exposed by the etching mask to form the ink feed hole. The rear surface of the substrate may be etched using a dry etching process, or a wet etching process using tetramethyl ammonium hydroxide (TMAH) or KOH as an etchant.

Since the top surface of the sacrificial layer can be planarized, the shape and dimensions of an ink passage can be easily controlled, thereby enhancing uniformity of the ink passage.

FIGS. 2A through 2L are cross-sectional views illustrating a method of manufacturing an inkjet printhead, according to exemplary embodiments of the present general inventive concept. According to exemplary embodiments of the method of manufacturing an inkjet printhead, a portion of a surface of a nozzle layer not including inner walls of a nozzle is protected using an alcohol-protecting group, a passage forming layer and a nozzle layer are formed using a negative photoresist composition containing a prepolymer, and the planarization of a sacrificial layer is performed using a CMP process.

Figure 2A:
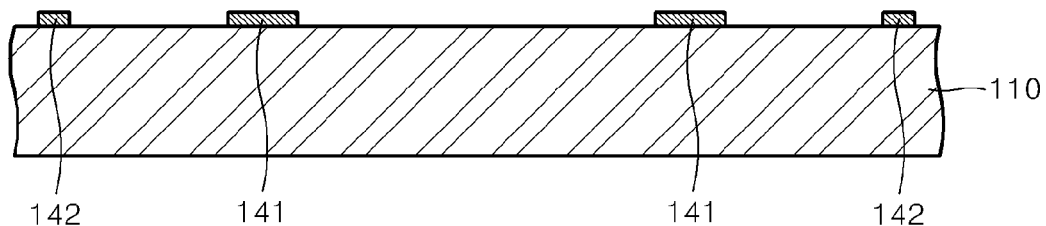
FIGS. 2A through 2L are cross-sectional views illustrating a method of manufacturing an inkjet printhead, according to exemplary embodiments of the present general inventive concept.

Referring to FIG. 2A, the inkjet printhead may include heaters 141 for heating ink and electrodes 142 for supplying current to the heaters 141 which are formed on a substrate 110. The substrate 110 may be a silicon wafer. Silicon wafers are widely used in manufacturing semiconductor devices, and can be effectively mass-produced.

In addition, the heaters 141 can be formed by depositing a resistance heating material such as tantalum-nitride or tantalum-aluminium alloy on the substrate 110 using a sputtering or chemical vapor deposition method, and then patterning the resistance heating material.

The electrodes 142 can be formed by depositing a conductive metal material such as aluminium or aluminium alloy on the substrate 110 using a sputtering method, and then patterning the metal material. Although not illustrated, a passivation layer formed of silicon oxide or silicon nitride can be formed on the heaters 141 and the electrodes 142.

Figure 2B:
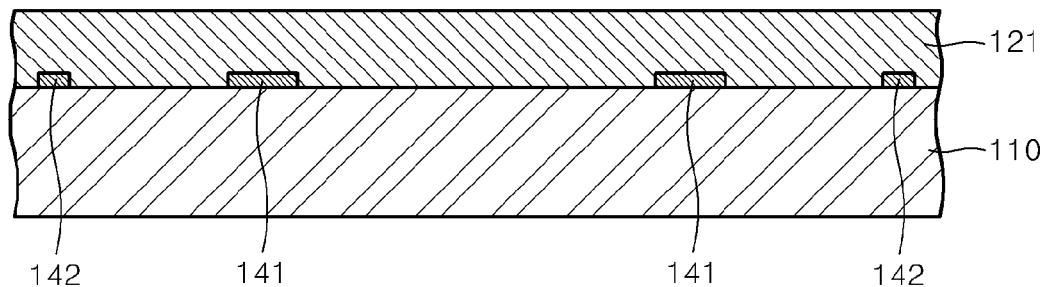

Referring to FIG. 2B, a first negative photoresist layer 121 is formed on the substrate 110 on which the heaters 141 and the electrodes 142 are formed. The first negative photoresist layer 121 forms a passage forming layer (120 in FIG. 2D) in which an ink chamber and a restrictor are formed, as will be described later. The first negative photoresist layer 121 is cross-linked by actinic rays such as ultraviolet rays, and thus is chemically stable when contacted by ink. The first negative photoresist layer 121 may be formed of a photoresist composition containing a prepolymer having glycidyl ether functional groups on repeating monomer units thereof, as described above. The first negative photoresist layer 121 is formed by coating the photoresist composition on the surface of the substrate 110 to a predetermined thickness. In this regard, the photoresist composition may be coated on the substrate 110 by spin coating.

Figure 2C:
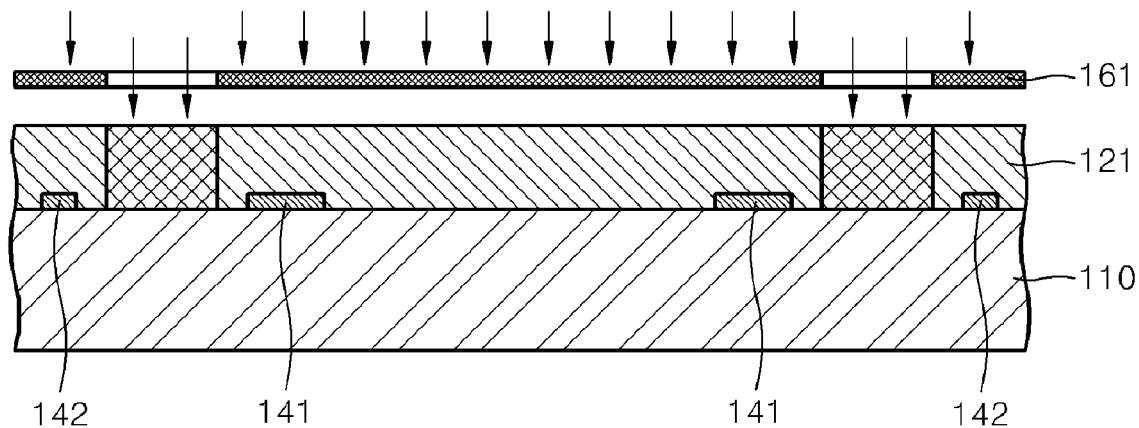

Referring to FIG. 2C, the first negative photoresist layer 121 is exposed to actinic radiation, preferably ultraviolet rays using a first photo mask 161 having ink chamber and restrictor patterns. In the exposing operation, an exposed portion of the first negative photoresist layer 121 is cured, and thus obtains chemical resistance and high mechanical strength. On the other hand, unexposed portions of the first negative photoresist layer 121 are easily dissolved by a developer.

Figure 2D:
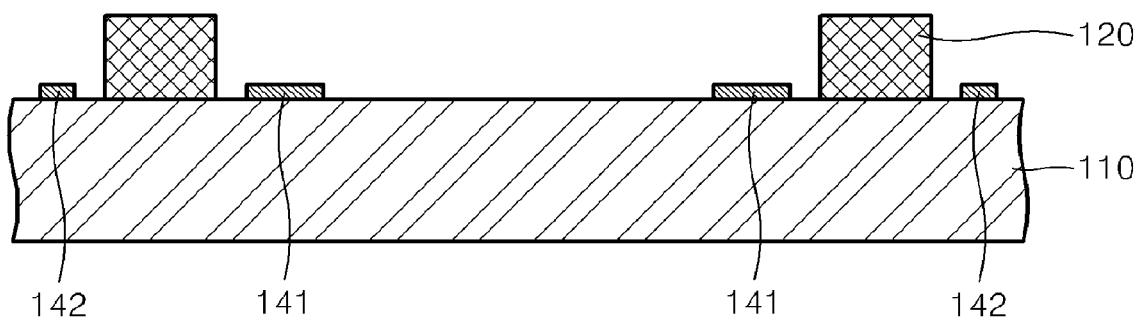

When the first negative photoresist layer 121 is developed, and thus the unexposed portions thereof is removed, as illustrated in FIG. 2D, a passage forming layer 120 that defines an ink passage is formed.

Figure 2E:
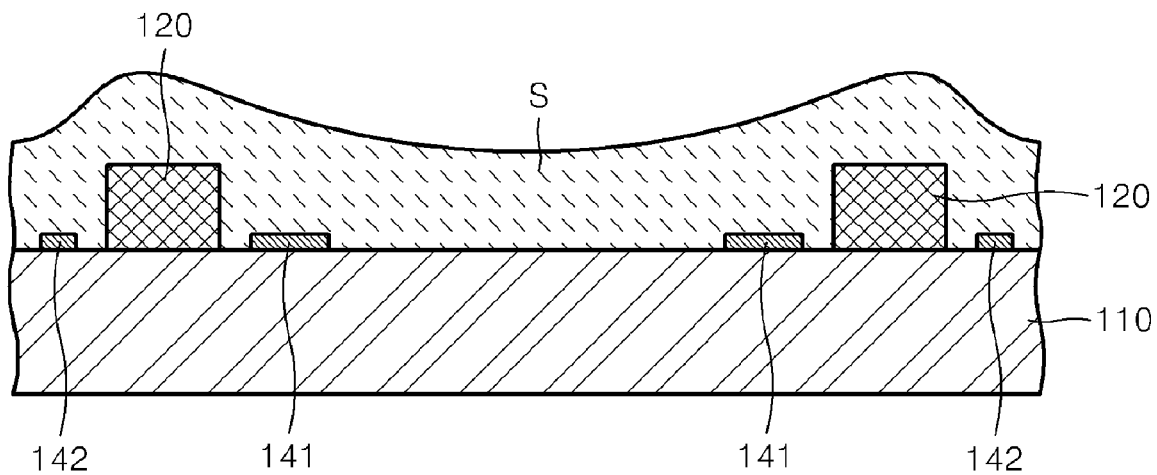

Referring to FIG. 2E, a sacrificial layer S is formed on the substrate 110 to cover the passage forming layer 120. The sacrificial layer S is formed to have a greater height than that of the passage forming layer 120. The sacrificial layer S can be formed to have a predetermined thickness by coating a positive photoresist or non-photosensitive soluble polymer on the substrate 110, for example, by spin coating. The positive photoresist may be an imide-based positive photoresist. An imide-based positive photoresist may be used as a material to form the sacrificial layer S to minimize the effect of a solvent on the imide-based positive photoresist. Generation of nitrogen gas is minimized when the imide-based positive photoresist is exposed to light. For this, a process in which an imide-based positive photoresist is hard baked at about 140° C. is needed. Also, the sacrificial layer S can be formed to a predetermined thickness by coating an aqueous non-photosensitive soluble polymer on the substrate 110 using a spin coating method, and then baking the aqueous non-photosensitive soluble polymer. The aqueous non-photosensitive soluble polymer may be at least one selected from the group including, but not limited to, a phenol resin, a polyurethane resin, an epoxy resin, a polyimide resin, an acryl resin, a polyamide resin, an urea resin, a melamin resin, and a silicon resin.

Figure 2F:
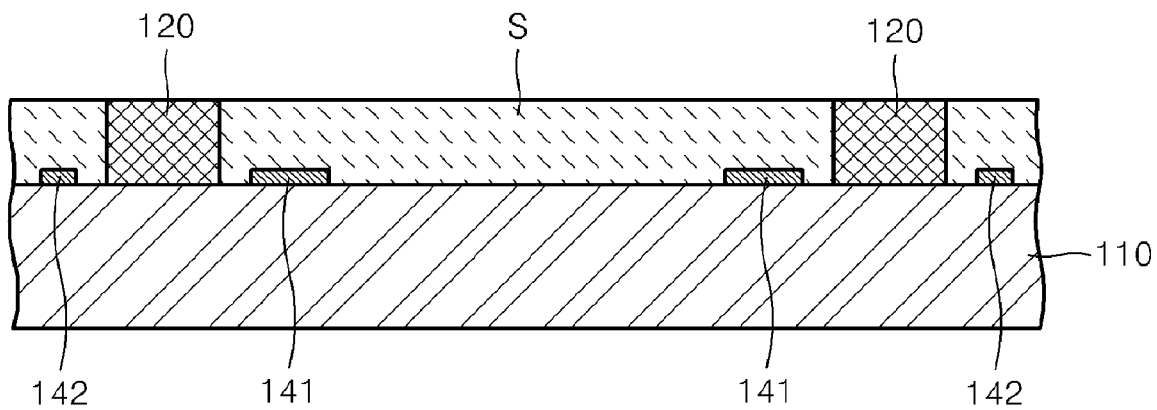

Referring to FIG. 2F, the top surfaces of the passage forming layer 120 and the sacrificial layer S are planarized using a chemical mechanical planarization (CMP) process. In detail, the top surfaces of the sacrificial layer S and the passage forming layer 120 are polished using a CMP process until an ink passage with a desired height is obtained. The top surfaces of the passage forming layer 120 and the sacrificial layer S are at the same height.

Figure 2G:
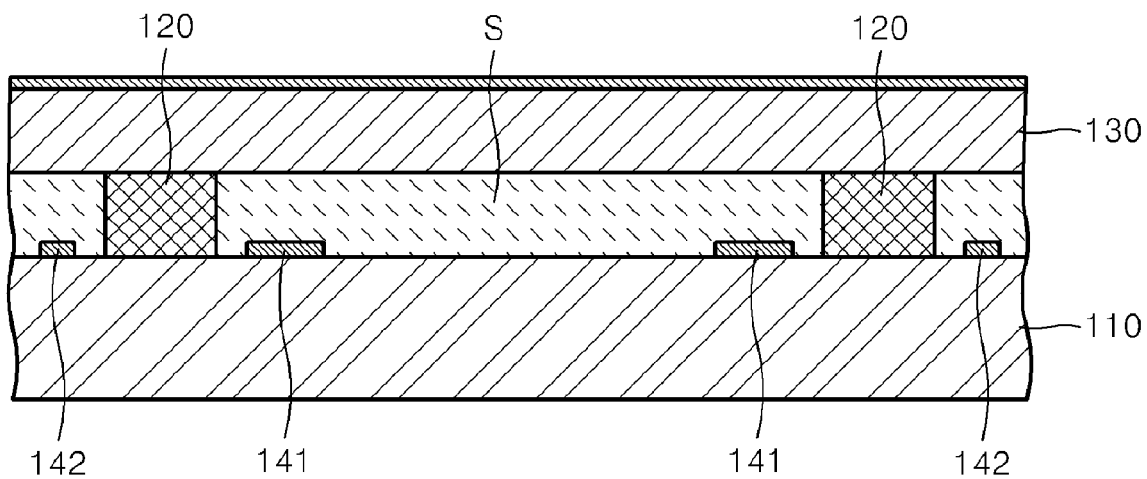

Referring to FIG. 2G, a second negative photoresist layer 131 is formed on the planarized passage forming layer 120 and the sacrificial layer S. The second negative photoresist layer 131 can be formed of a composition containing a prepolymer having glycidyl ether functional groups, ring-opened glycidyl ether functional groups, or oxytein functional groups, and also phenol novolac resin backbones, bisphenol-A-based backbones, bisphenol-F-based backbones, or alicyclic backbones on repeating monomer units thereof like in the formation of the first negative photoresist layer 121.

The second negative photoresist layer 131 is used to form a nozzle layer (130 in FIG. 2I) as will be described later. The second negative photoresist layer 131 is cross-linked by actinic radiation such as ultraviolet rays, and thus is chemically stable when contacted by ink. The second negative photoresist layer 131 is formed by coating the composition described above on the passage forming layer 120 and the sacrificial layer S to a predetermined thickness using a spin coating method. The second negative photoresist layer 131 is formed to have a sufficient thickness to obtain a sufficiently long nozzle and to have a sufficient strength to withstand a change in the pressure of an ink chamber.

As illustrated in FIG. 2F, since the sacrificial layer S and the passage forming layer 120 are planarized to have the same height, problems such as the edge of the sacrificial layer S being deformed or melted by a reaction between a material used to form the second negative photoresist layer 131 and a material used to form the sacrificial layer S are minimized or do not occur. Accordingly, the second photoresist layer 131 can be adhered to the top surface of the passage forming layer 120.

The second negative photoresist layer 131 is coated with a solution containing an alcohol-protecting group, by a process such as dipping, spin coating, or the like, to form a protection layer 200, and then the protection layer 200 is soft baked at a predetermined temperature to protect a surface of the second negative photoresist layer 131 using an alcohol-protecting group.

Figure 2H:
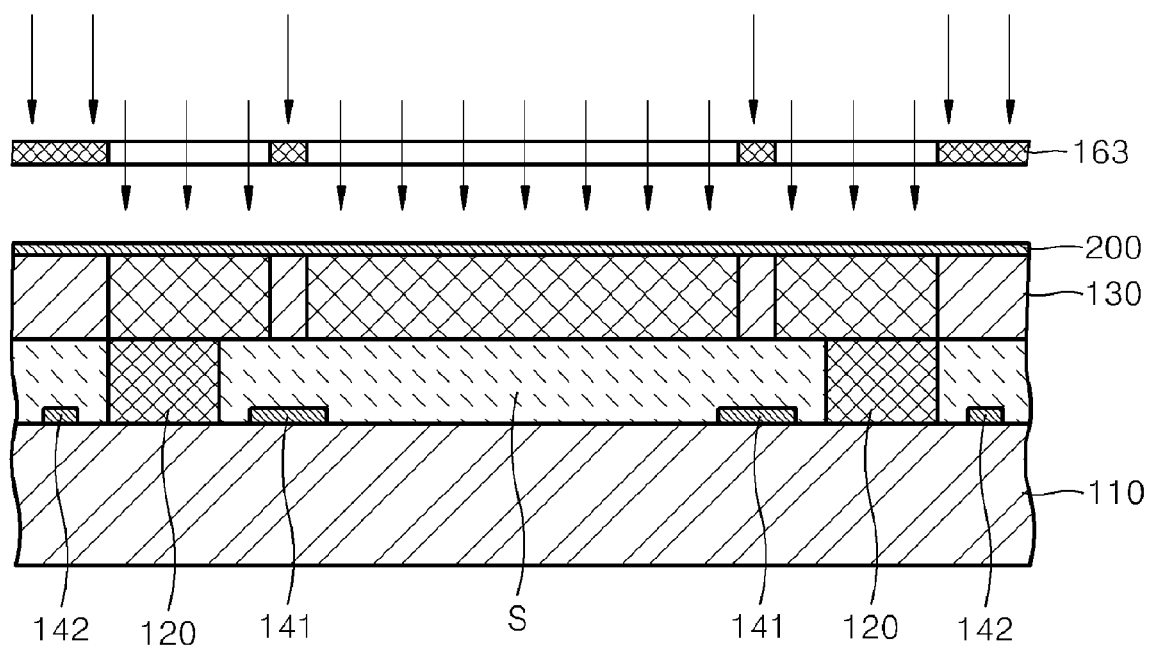

Referring to FIG. 2H, the second negative photoresist layer 131 is exposed to light using a second photo mask 163 having a nozzle pattern.

Figure 2I:
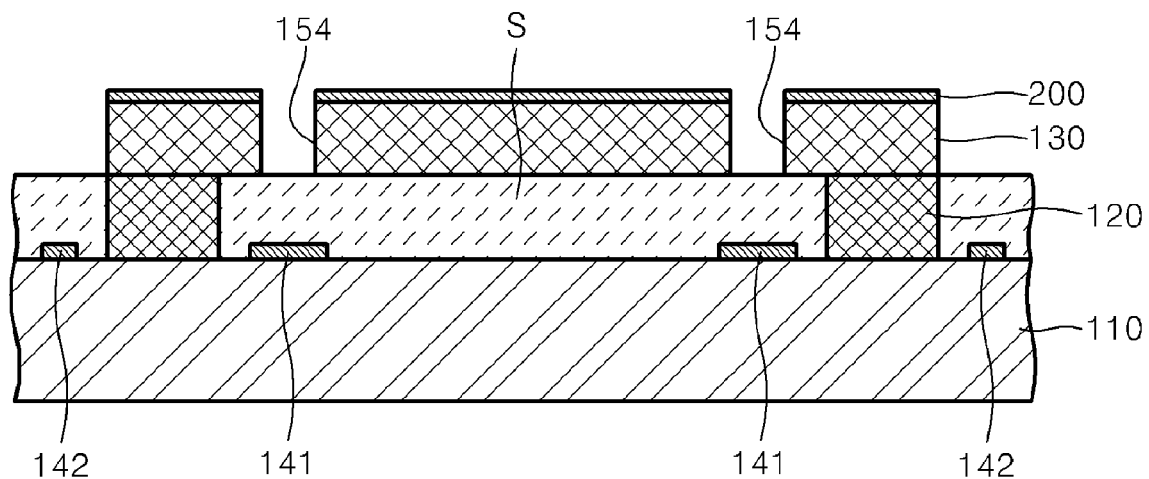

The second negative photoresist layer 131 is developed to remove an unexposed portion of the second negative photoresist layer 131. As a result, nozzles 154 are formed and a portion of the second negative photoresist layer 131 cured by exposure to light remains to form a nozzle layer 130, as illustrated in FIG. 2I. When the sacrificial layer S includes an imide-based positive photoresist as described above, nitrogen gas may not be generated even though the sacrificial layer S is exposed to light through the second negative photoresist layer 131. Therefore, deformation of the nozzle layer 130 by nitrogen gas may be minimized and/or prevented.

When the nozzles 154 are formed using the above process, the surface of the nozzle layer 130 is protected by the alcohol-protecting group, and the alcohol-protecting group is not formed on inner walls of the nozzles 154.

Figure 2J:
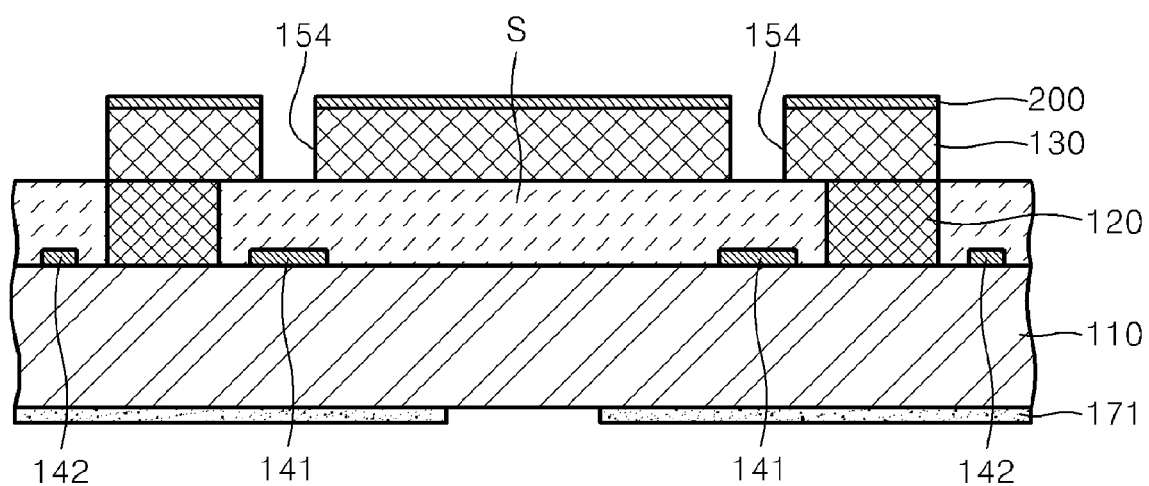

Referring to FIG. 2J, an etching mask 171 for forming an ink feed hole (151 in FIG. 2K) is formed on a rear surface of the substrate 110. The etching mask 171 may be formed by coating the substrate 110 with a positive or negative photoresist, and then patterning the positive or negative photoresist.

Figure 2K:
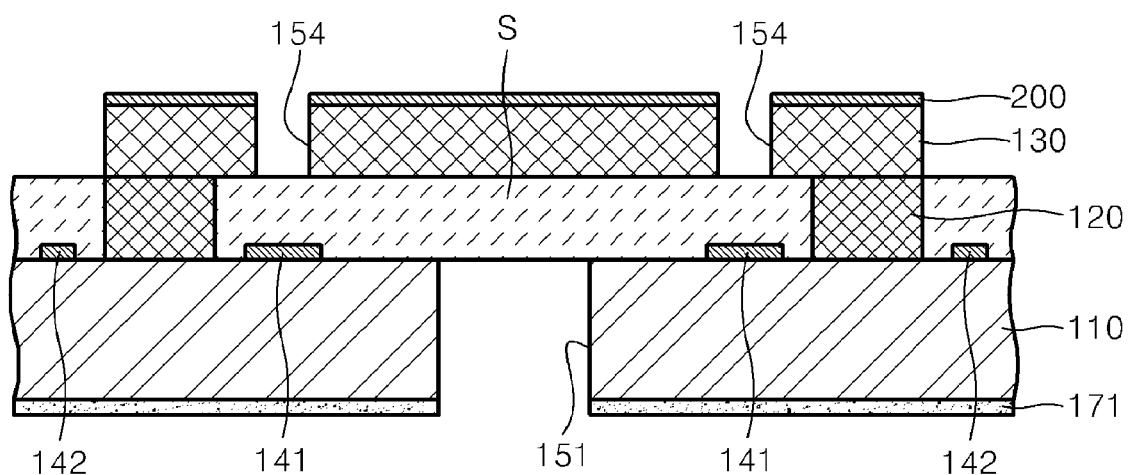

Referring to FIG. 2K, the substrate 110 exposed by the etching mask 171 is etched from the rear surface thereof to be perforated to thereby form an ink feed hole 151, and then the etching mask 171 is removed. The process of etching the rear surface of the substrate 110 can be performed by dry etching with plasma. The process of etching the rear surface of the substrate 110 may also be performed by wet etching using tetramethyl ammonium hydroxide (TMAH) or KOH as an etchant.

Figure 2L:
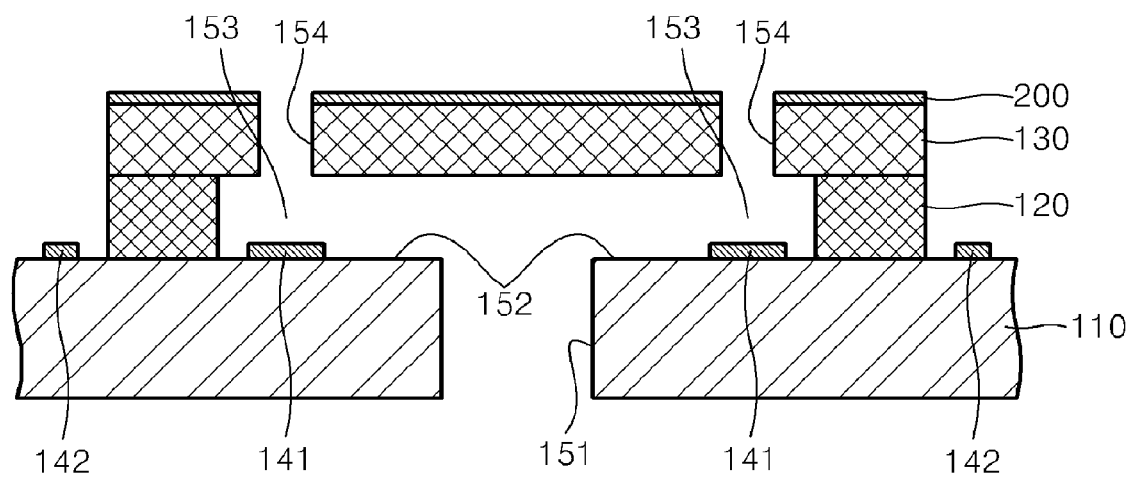

When the sacrificial layer S is removed using a solvent, as illustrated in FIG. 2L, an ink chamber 153 and a restrictor 152 formed in the passage forming layer 120 are formed, and the electrodes 142 for supplying current to the heaters 141 are exposed. This completes the manufacture of an inkjet printhead according to exemplary embodiments of the present general inventive concept.

Figure 3A:
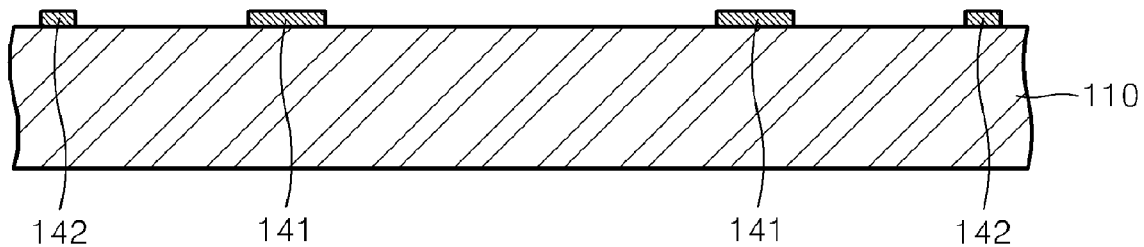
FIGS. 3A through 3L are cross-sectional views illustrating a method of manufacturing an inkjet printhead, according to exemplary embodiments of the present general inventive concept.
Figure 3B:
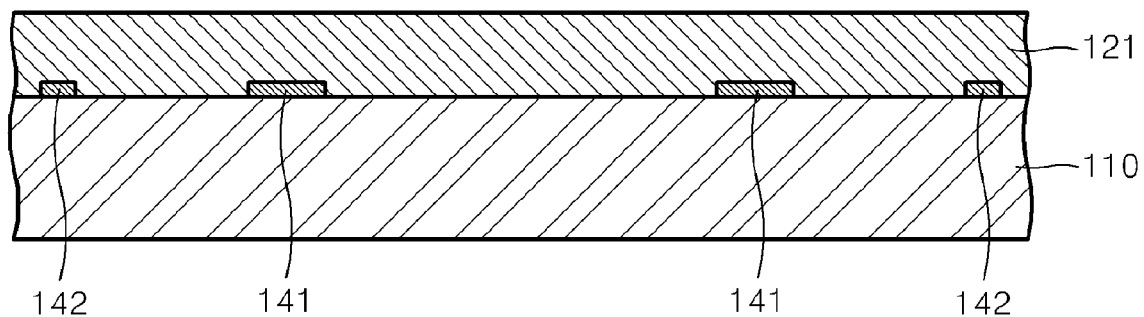
Figure 3C:
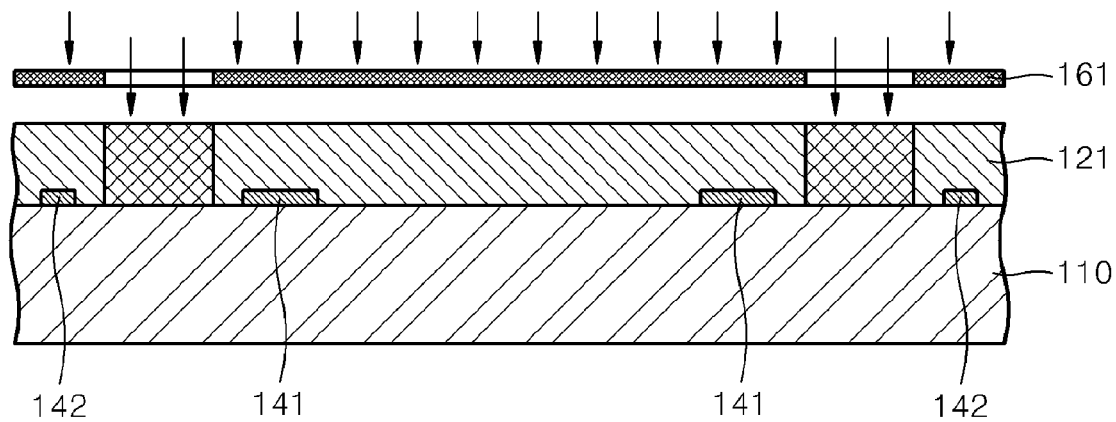
Figure 3D:
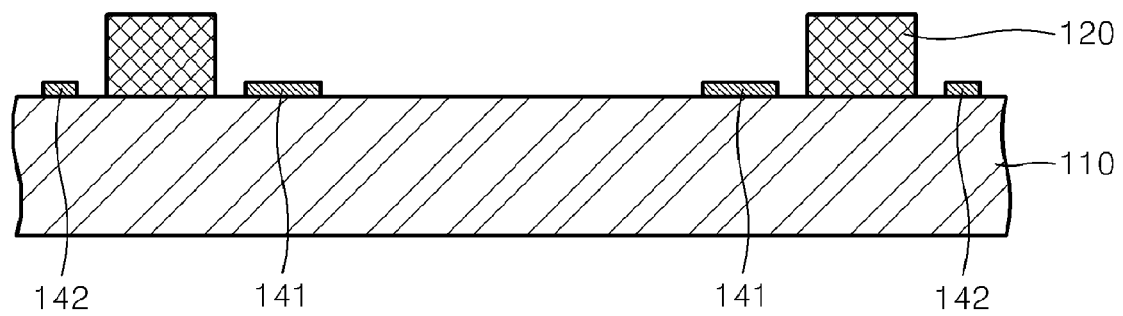
Figure 3E:
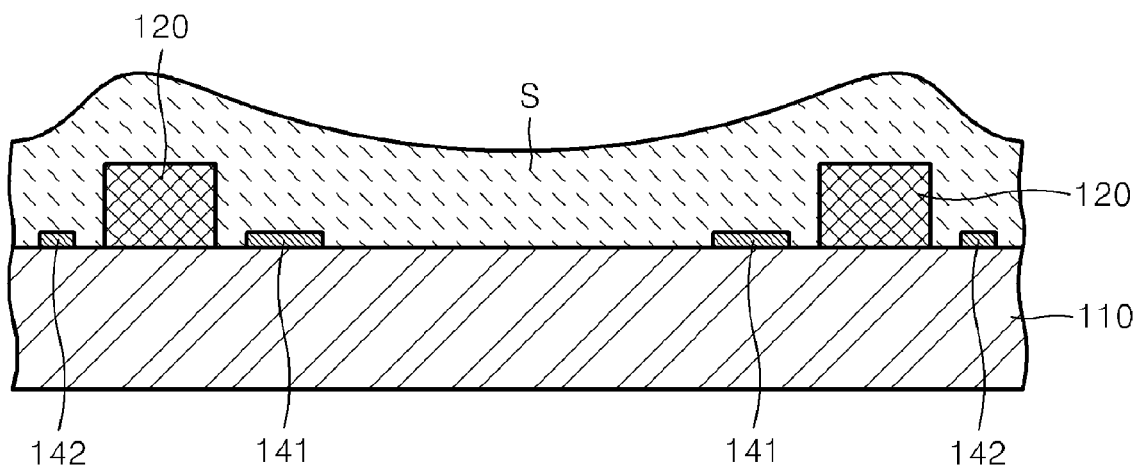
Figure 3F:
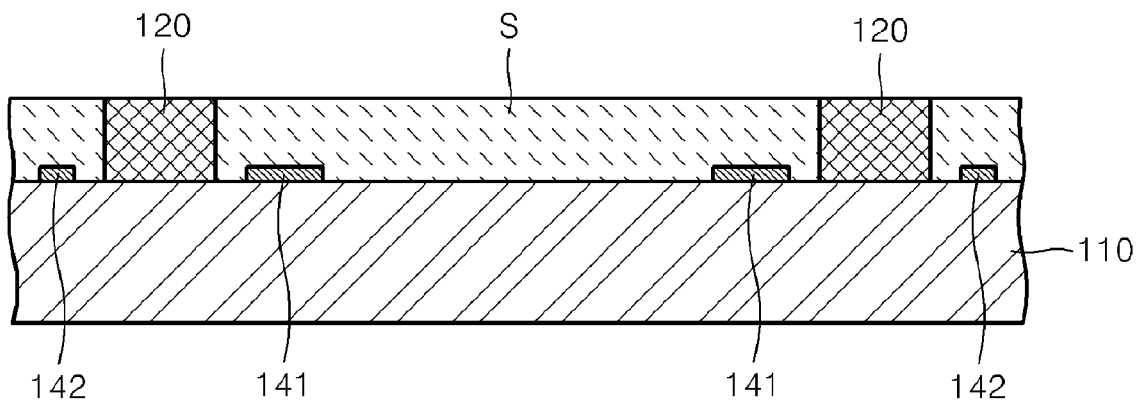
Figure 3G:
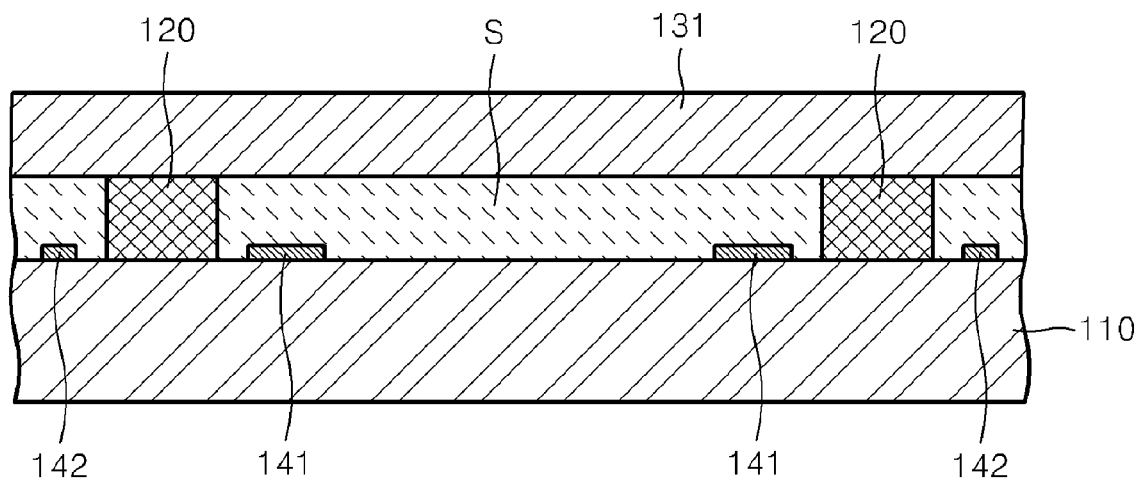
Figure 3H:
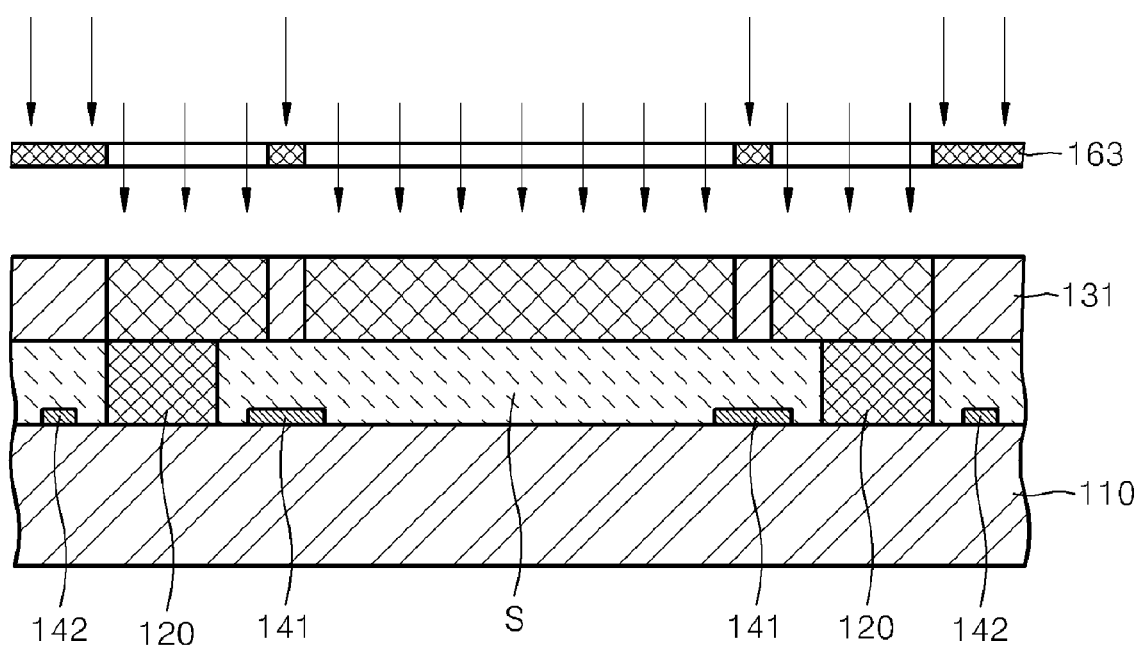

FIGS. 3A through 3L are cross-sectional views illustrating a method of manufacturing an inkjet printhead, in which a surface of a nozzle layer, including inner walls of nozzles, is protected using an alcohol-protecting group, according to exemplary embodiments of the present general inventive concept. The operations of FIG. 3A to FIG. 3G, until the formation of a second negative photoresist composition layer 131, may be performed in a similar manner as the operations of the exemplary embodiments illustrated in FIGS. 2A to 2L. A process of protecting a surface of the nozzle layer using an alcohol-protecting group is further performed after forming the nozzles. As illustrated in FIG. 3H, the second negative photoresist layer 131 is exposed to light using a second photomask 163 having a nozzle pattern. The second negative photoresist layer 131 is developed to remove unexposed portions of the second negative photoresist layer 131, and thus nozzles 154 may be formed in a manner similar to the exemplary embodiment illustrated in FIG. 2I, and portions that are cured by photo-exposure remain and form the nozzle layer 130.

A solution containing an alcohol-protecting group is coated on the nozzle layer 130 including the nozzles 154, by methods that may include, but are not limited to, dipping or spin coating, thereby forming an alcohol protection layer 200 formed of the alcohol-protecting group. Then the alcohol protection layer 200 may be soft-baked to protect the surface of the nozzle layer 130 including the inner walls of the nozzles 154 using the alcohol-protecting group.

Figure 3I:
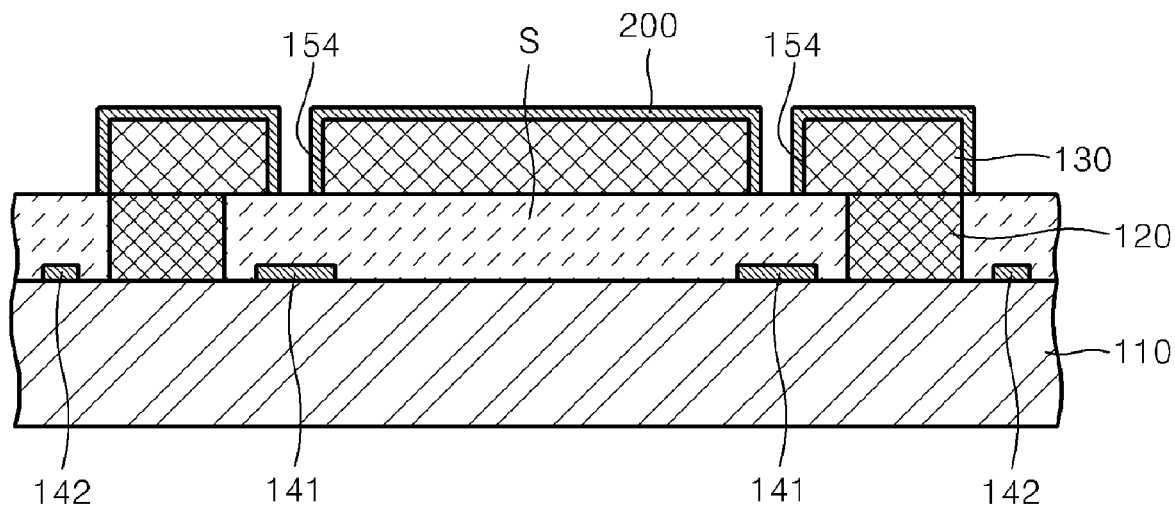
Figure 3J:
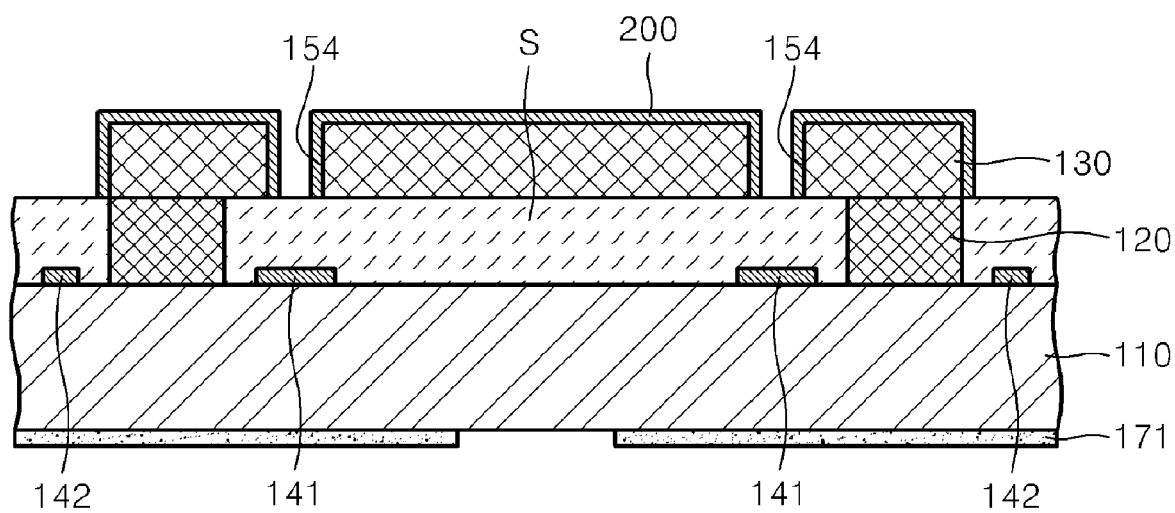
Figure 3K:
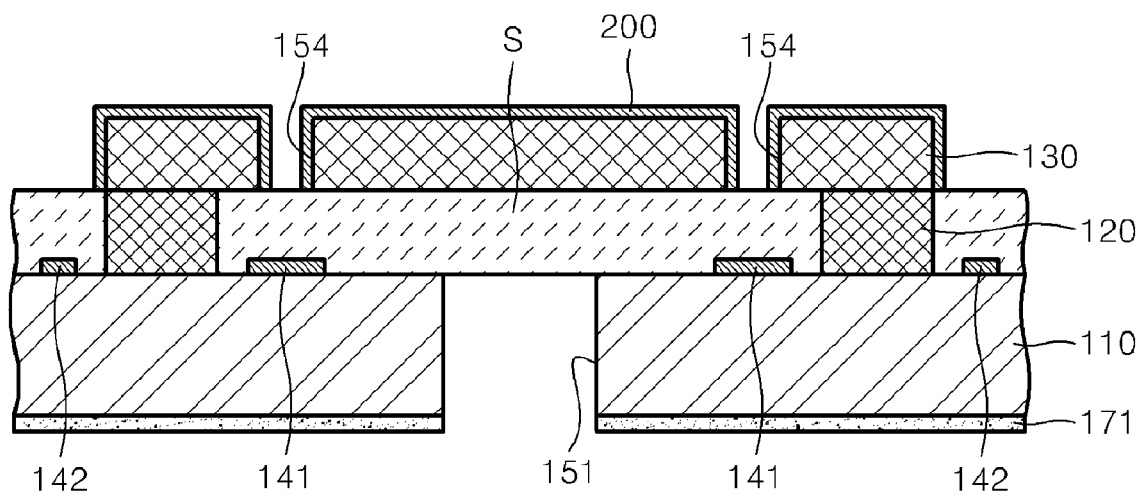
Figure 3L:
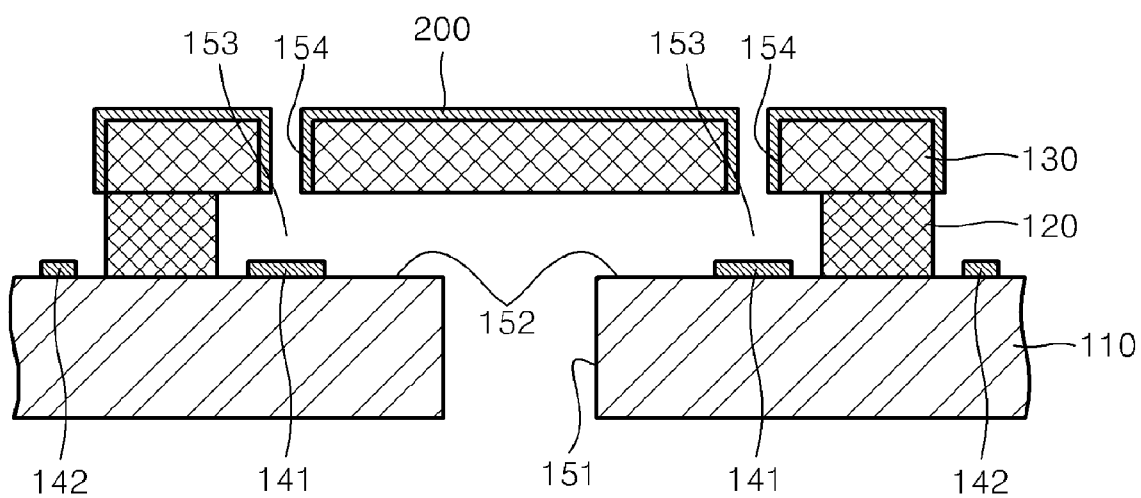

Processes of forming an ink feed hole 151 in a rear surface of the substrate 110 and removing the sacrificial layer S may be performed, as illustrated in FIGS. 3J-3L, in a similar manner as in the exemplary embodiment illustrated in FIGS. 2J-2L.

Hereinafter, the present general inventive concept will be described in detail with reference to examples. These examples are for illustrative purposes only, and are not intended to limit the scope of the present general inventive concept.

Preparation Example 1

Preparation of Negative Photoresist Composition 30 g of PGMEA (commercially available from Samchun Chemical Co.), 2 g of diglycidyl hexahydro phthalate (commercially available from Sigma-Aldrich), and 2 g of SP-172 (commercially available from Asahi Denka Korea Chemical Co.) were mixed in a jar to manufacture a resist solution. Then, 40 g of EPON SU-8 (commercially available from Hexion Speciality Co.) was added to the jar and the solution was mixed by an impeller for about 24 hours to form a negative photoresist composition.

Preparation Example 2

A negative photoresist composition was prepared in the same manner as Example 1 except that the diglycidyl hexahydro phthalate of Example 1 was not used.

Preparation Example 3

A solution containing an alcohol-protecting group was prepared by dissolving 2 g of chlorotrimethylsilane as an alcohol-protecting group, in 100 g of a solvent.

Example 1

A tantalum nitride heater pattern having a thickness of about 550 Å and an electrode pattern formed of AlSiCy alloy having a thickness of about 550 Å (Si and Cu each of 1 wt % or less) were formed on a 6-inch silicon wafer using a typical sputtering process and a photolithography process (refer to FIG. 3A).

As illustrated in FIG. 3B, the negative photoresist composition prepared in Example 1 was spin-coated at 2000 rpm for 40 seconds on the entire surface of the silicon wafer on which the heater pattern and the electrode pattern were formed, and baked at 95° C. for 7 minutes to form a first negative photoresist layer. As illustrated in FIG. 2C, the first negative photoresist layer was exposed to i-line ultraviolet rays using a first photomask having predetermined patterns of an ink chamber and a restrictor. The amount of photo-exposure was controlled to be 130 mJ/cm2. The wafer was baked at 95° C. for 3 minutes, and dipped in PGMEA developer for 1 minute and developed, and rinsed with isopropanol for 20 seconds. Thus, a passage forming layer (120 in FIG. 3D) was formed.

As illustrated in FIG. 3E, an imide-based positive photoresist (PW-1270 available by TORAY) was spin-coated at 1000 rpm for 40 seconds on the entire surface of the wafer having the passage forming layer formed thereon, and baked at about 140° C. for 10 minutes, thereby forming a sacrificial layer. The thickness of the sacrificial layer S was controlled such that the sacrificial layer S was formed to be about 5 μm thicker than the passage forming layer.

Top surfaces of the passage forming layer and the sacrificial layer were planarized using a CMP process as illustrated in FIG. 3F. A polishing pad (JSR FP 8000 commercially available from JSR) was applied to the wafer such that the sacrificial layer faced the polishing pad of a polishing plate. The wafer was disposed on the polishing pad and pressed with a backing pad by a press head at a pressure of about 10 to 15 kPa. While supplying polishing slurry (FUJIMI Corporation, POLIPLA 103) to the polishing pad, the press head was rotated with respect to the polishing pad. The rotational speeds of the press head and the polishing pad were 40 rpm, respectively. The backing pad was formed of a material having shore D hardness of 30 to 70. By adjusting the etch rate to be 5-7 μm, the sacrificial layer was removed until the top surface of the passage forming layer was removed by about 1 μm to planarize the passage forming layer and the sacrificial layer.

A nozzle layer was formed on the silicon wafer, on which the passage forming layer and the sacrificial layer were formed, in the same manner as the passage forming layer using the negative photoresist composition obtained in Preparation Example 1 and a photomask (refer to FIGS. 3G, 3H, and 3I).

The nozzle layer including nozzles was dipped in the solution containing the alcohol-protecting group obtained in Preparation Example 3 to form a protection layer containing an alcohol-protecting group. The protection layer containing an alcohol-protecting group was soft-baked at 100° C. for 10 minutes, thereby bonding the alcohol-protecting group to the surface of the nozzle layer.

As illustrated in 3J, an etch mask was formed using a typical photolithographic method for forming an ink feed hole in a rear surface of the silicon wafer. As illustrated in FIG. 3K, the silicon wafer was plasma-etched starting from the rear surface of the silicon wafer 110 exposed by the etch mask to form an ink feed hole, and then the etch mask was removed. The power of a plasma etching apparatus used was 2000 Watts, an etching gas was a mixed gas of $SF_6$ and $O_2$ (mixing volume ratio=10:1), and the silicon etch rate was 3.7 μm/min.

The silicon wafer was dipped in a methyl lactate solvent for 2 hours to remove the sacrificial layer, and thus an ink chamber and a restrictor formed in the passage forming layer 120 were formed in the space formerly occupied by the sacrificial layer. Thus, an inkjet printhead as illustrated in FIG. 3L was formed.

As described above, an inkjet printhead, in which a surface of the nozzle layer is protected using the alcohol-protecting group obtained from Preparation Example 3, was manufactured.

Comparative Example 1

An inkjet printhead was manufactured in the same manner as in Example 1 except that the protecting process using an alcohol-protecting group was not conducted.

Experimental Example

Measurement of Contact Angles

Figure 4:
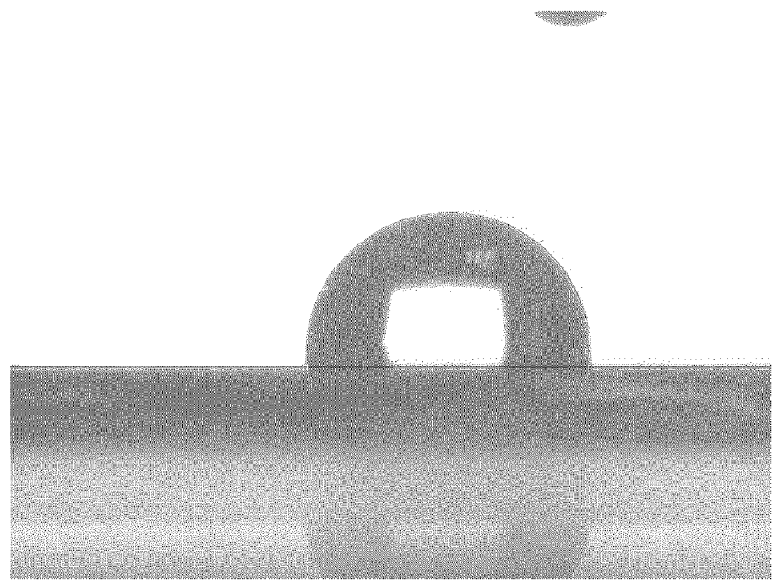
FIG. 4 is a optical microscopic image illustrating a contact angle of a surface of a nozzle layer formed according to Comparative Example 1.
Figure 5:
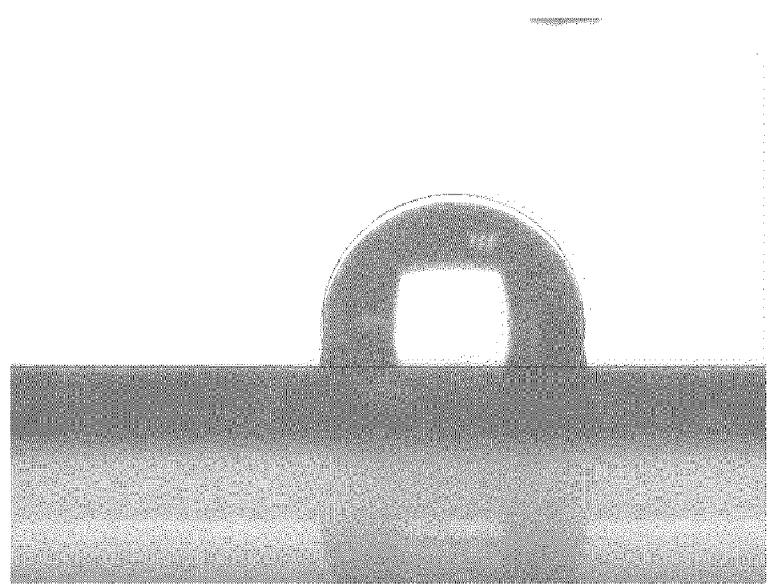
FIG. 5 is an optical microscopic image illustrating a contact angle of a surface of a nozzle layer formed according to Example 1 of the present general inventive concept.

A contact angle was measured by titrating demineralized water to the surface of the nozzle layers of Comparative Example 1 and Example 1, as illustrated in FIGS. 4 and 5.

FIG. 4 illustrates a contact angle on the surface of the nozzle layer of Comparative Example 1 which is not protected by an alcohol-protecting group, and the contact angle was 88 degrees. FIG. 5 illustrates a contact angle on the surface of the nozzle layer of Example 1 that is protected using an alcohol-protecting group, and the contact angle was 107 degrees. Thus, it can be determined from the increased contact angle that the alcohol-protecting group is bonded to the surface of the nozzle layer.

According to the exemplary embodiments of the present general inventive concept, by protecting a surface of a nozzle layer using an alcohol-protecting group, —OH reactivity of the nozzle layer can be removed and thus reaction of the nozzle layer with materials that pass through nozzles can be prevented. Additionally, formation of metal composites can be prevented, thereby preventing clogging of nozzles. Also, as the surface of the nozzles can be modified and improved according to the type of the alcohol-protecting group, nozzles can be deformed in accordance with the type of ink, whether it is water-soluble ink or organic ink. Moreover, the surface of the nozzles can be hydrophobicized, thereby increasing a contact angle on the surface of the nozzle layer and preventing ink spreading during ink ejection.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. An inkjet printhead comprising:
   a substrate;
   a passage forming layer formed on the substrate; and
   a nozzle layer formed on the passage forming layer and comprising a material including an epoxy group or a hydroxyl group,
   the epoxy group or the hydroxyl group being protected by an alcohol-protecting group bonded to the epoxy group or the hydroxyl group.

2. The inkjet printhead of claim 1, wherein the alcohol-protecting group comprises one of an acetyl group, a beta-methoxyethoxymethyl ether (MEM), a methoxymethyl ether (MOM), a p-methoxybenzyl ether (PMB), a methylthiomethyl ether, a pivaloyl (Piv), a tetrahydropyran (TFP), and silyl ether.

3. The inkjet printhead of claim 1, wherein a portion of a surface of the nozzle layer not including inner walls of a nozzle of the nozzle layer is protected using the alcohol-protecting group.

4. The inkjet printhead of claim 1, wherein a surface of the nozzle layer including inner walls of a nozzle of the nozzle layer is protected using the alcohol-protecting group.

5. The inkjet printhead of claim 1, wherein the epoxy group of the nozzle layer is protected by converting the epoxy group to a hydroxyl group by hydrolysis and then protecting the hydroxyl group with an alcohol-protecting group.

6. The inkjet printhead of claim 5, wherein the hydrolysis of the epoxy group forms two hydroxyl groups to which the alcohol-protecting group is bonded.

7. The inkjet printhead of claim 1, wherein the material of the nozzle layer comprises a polymer including at least one prepolymer selected from the group consisting of compounds expressed by Formulae 1 through 9 below:

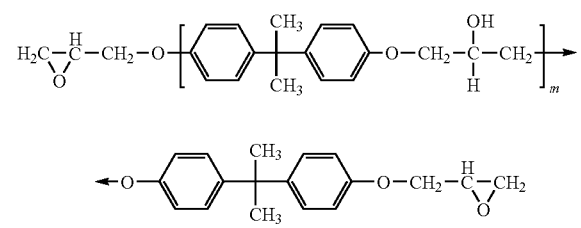

<Formula 1>

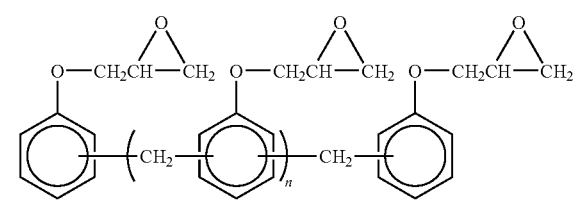

<Formula 2>

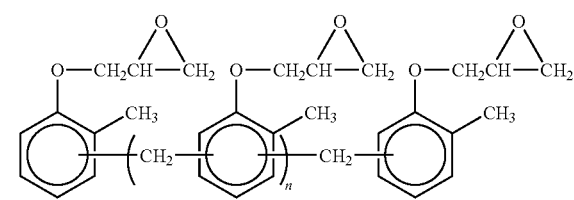

<Formula 3>

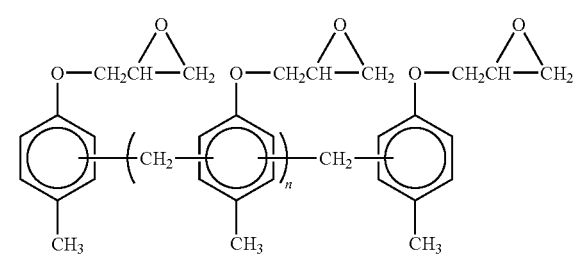

<Formula 4>

<Formula 5>

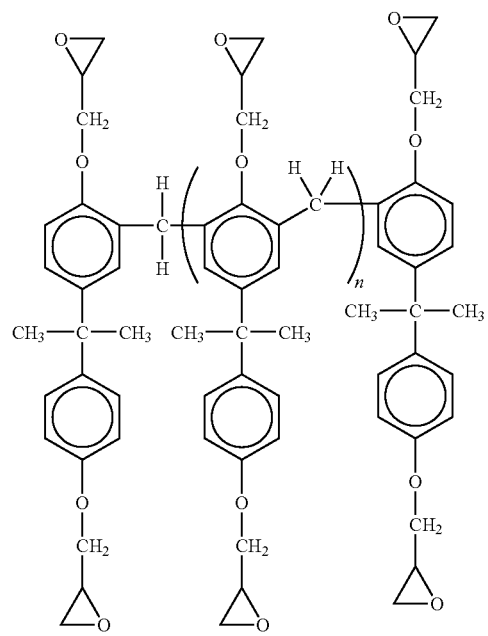

<Formula 6>

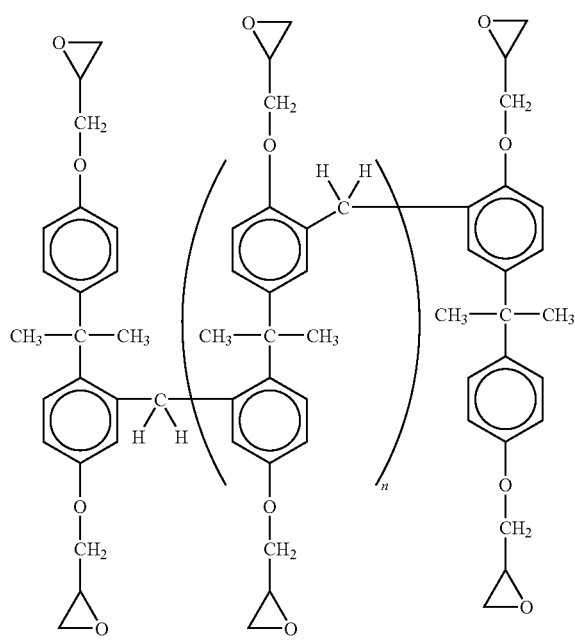

<Formula 7>

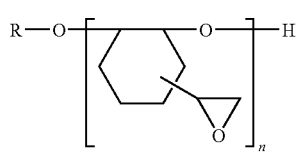

<Formula 8>

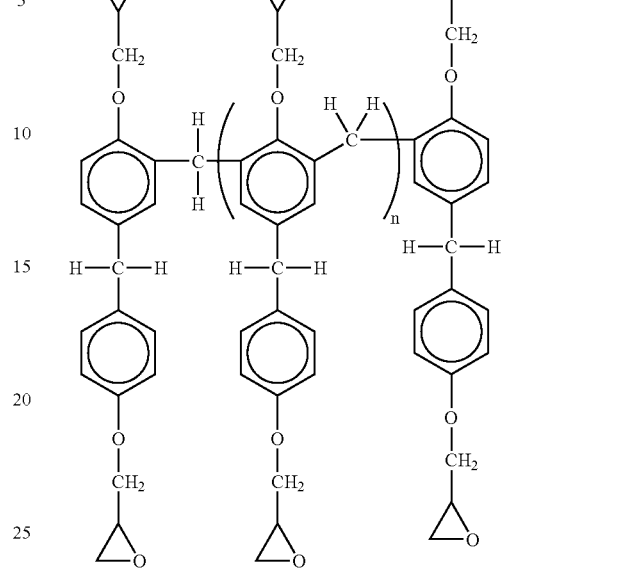

<Formula 9>

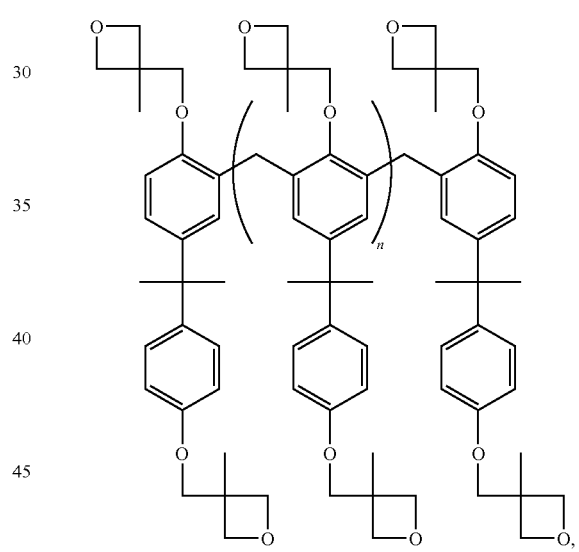

8. The inkjet printhead of claim 1, wherein the alcohol protecting group bonded to the epoxy group or the hydroxyl group reduces reactivity of the epoxy group or the hydroxyl group.

9. An inkjet printhead, comprising:
a nozzle layer including a plurality of nozzles; and
an alcohol-protecting group formed on the nozzle layer to bond with a reactive functional group in a material of the nozzle layer to protect the nozzle layer.

10. The inkjet printhead of claim 9, wherein the nozzle layer is formed of a material including an epoxy group or a hydroxyl group.

11. The inkjet printhead of claim 9, further comprising:
a substrate; and
a passage forming layer formed on the substrate,
wherein the nozzle layer is formed on the passage forming layer.

12. The inkjet printhead of claim 11, wherein the alcohol-protecting group is formed on a surface of the nozzle layer that faces away from the passage forming layer.

13. The inkjet printhead of claim 12, wherein the alcohol-protecting group is formed on inner walls of the nozzle layer.

14. The inkjet printhead of claim 11, wherein an alcohol-protecting group is formed between the passage forming layer and the nozzle layer.

* * * * *